United States Patent
Wood et al.

(10) Patent No.: US 11,888,030 B2
(45) Date of Patent: *Jan. 30, 2024

(54) METHOD AND SYSTEM OF OPERATING A BI-DIRECTIONAL DOUBLE-BASE BIPOLAR JUNCTION TRANSISTOR (B-TRAN)

(71) Applicant: IDEAL POWER INC., Austin, TX (US)

(72) Inventors: John Wood, Wellingborough (GB); Alireza Mojab, Austin, TX (US); Daniel Brdar, Driftwood, TX (US); Ruiyang Yu, Austin, TX (US)

(73) Assignee: IDEAL POWER INC., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/053,839

(22) Filed: Nov. 9, 2022

(65) Prior Publication Data

US 2023/0066664 A1  Mar. 2, 2023

Related U.S. Application Data

(63) Continuation of application No. 17/537,726, filed on Nov. 30, 2021, now Pat. No. 11,522,051.

(60) Provisional application No. 63/123,704, filed on Dec. 10, 2020.

(51) Int. Cl.
*H01L 29/10* (2006.01)
*H03K 17/082* (2006.01)
*H01L 29/747* (2006.01)
*H01L 29/732* (2006.01)

(52) U.S. Cl.
CPC ........ *H01L 29/1004* (2013.01); *H01L 29/732* (2013.01); *H01L 29/747* (2013.01); *H03K 17/0826* (2013.01)

(58) Field of Classification Search
None
See application file for complete search history.

(56) References Cited

U.S. PATENT DOCUMENTS

| 9,029,909 B2 | 5/2015 | Blanchard et al. |
| 9,035,350 B2 | 5/2015 | Blanchard et al. |
| 9,054,706 B2 | 6/2015 | Blanchard et al. |

(Continued)

OTHER PUBLICATIONS

International Searching Authority, International Search Report and Written Opinion for PCT/US21/61078 dated Mar. 22, 2022, 20 pages.

*Primary Examiner* — Thomas J. Hiltunen
*Assistant Examiner* — Khareem E Almo
(74) *Attorney, Agent, or Firm* — Dickinson Wright PLLC; Mark E. Scott

(57) ABSTRACT

Operating a bi-directional double-base bipolar junction transistor (B-TRAN). One example is a method comprising: conducting a first load current from an upper terminal of the power module to an upper-main lead of the transistor, through the transistor, and from a lower-main lead of the transistor to a lower terminal of the power module; and then responsive assertion of a first interrupt signal, interrupting the first load current from the lower-main lead to the lower terminal by opening a lower-main FET and commutating a first shutoff current through a lower-control lead the transistor to the lower terminal; and blocking current from the upper terminal to the lower terminal by the transistor.

20 Claims, 11 Drawing Sheets

(56) References Cited

U.S. PATENT DOCUMENTS

| | | |
|---|---|---|
| 9,054,707 B2 | 6/2015 | Blanchard et al. |
| 9,059,710 B2 | 6/2015 | Blanchard et al. |
| 9,190,894 B2 | 11/2015 | Blanchard et al. |
| 9,203,400 B2 | 12/2015 | Blanchard et al. |
| 9,203,401 B2 | 12/2015 | Blanchard et al. |
| 9,209,713 B2 | 12/2015 | Blanchard et al. |
| 9,209,798 B2 | 12/2015 | Blanchard et al. |
| 9,231,582 B1 | 1/2016 | Blanchard et al. |
| 9,337,262 B2 | 5/2016 | Blanchard et al. |
| 9,355,853 B2 | 5/2016 | Blanchard et al. |
| 9,356,595 B2 | 5/2016 | Blanchard et al. |
| 9,369,125 B2 | 6/2016 | Blanchard et al. |
| 9,374,084 B2 | 6/2016 | Blanchard et al. |
| 9,374,085 B2 | 6/2016 | Blanchard et al. |
| 9,444,449 B2 | 9/2016 | Bundschuh et al. |
| 9,614,028 B2 | 4/2017 | Blanchard et al. |
| 9,647,553 B2 | 5/2017 | Blanchard et al. |
| 9,660,551 B2 | 5/2017 | Blanchard et al. |
| 9,679,999 B2 | 6/2017 | Blanchard et al. |
| 9,742,385 B2 | 8/2017 | Alexander |
| 9,786,773 B2 | 10/2017 | Blanchard et al. |
| 9,787,298 B2 | 10/2017 | Blanchard et al. |
| 9,787,304 B2 | 10/2017 | Blanchard et al. |
| 9,799,731 B2 | 10/2017 | Alexander |
| 9,818,615 B2 | 11/2017 | Blanchard et al. |
| 9,899,868 B2 | 2/2018 | Blanchard et al. |
| 9,900,002 B2 | 2/2018 | Blanchard et al. |
| 10,056,372 B2 * | 8/2018 | Alexander ......... H03K 17/0826 |
| 10,211,283 B2 | 2/2019 | Blanchard et al. |
| 10,418,471 B2 | 9/2019 | Blanchard et al. |
| 10,497,699 B2 | 12/2019 | Blanchard et al. |
| 10,580,885 B1 | 3/2020 | Blanchard et al. |
| 10,892,354 B2 | 1/2021 | Blanchard et al. |
| 2008/0203852 A1 * | 8/2008 | Gottlieb ................ H02N 2/145 |
| | | 310/317 |
| 2013/0032882 A1 | 7/2013 | Salcedo et al. |
| 2016/0197517 A1 * | 7/2016 | Bundschuh ............... H02J 9/06 |
| | | 307/64 |
| 2016/0344300 A1 | 11/2016 | Alexander |
| 2017/0085179 A1 * | 3/2017 | Alexander ......... H01L 29/7393 |
| 2018/0026122 A1 | 1/2018 | Blanchard |
| 2019/0267810 A1 * | 8/2019 | Johns ..................... H02B 7/06 |
| 2020/0243674 A1 | 7/2020 | Alexander et al. |

\* cited by examiner

METHOD AND SYSTEM OF OPERATING A BI-DIRECTIONAL DOUBLE-BASE BIPOLAR JUNCTION TRANSISTOR (B-TRAN)

CROSS-REFERENCE TO RELATED APPLICATIONS

This application is a continuation of U.S. application Ser. No. 17/537,726 filed Nov. 30, 2021, which claims the benefit of U.S. Provisional App. No. 63/123,704 filed Dec. 10, 2020. Both the noted applications are incorporated by reference herein as if reproduced in full below.

BACKGROUND

A bi-directional double-base bipolar junction transistor (hereafter B-TRAN) is junction transistor constructed with a base and collector-emitter on a first side of the bulk region, and a distinct and separate base and collector-emitter on a second side of the bulk region opposite the first side. When properly configured by an external driver, electrical current may selectively flow through a B-TRAN in either direction, and thus B-TRAN devices are considered bi-directional devices. Based on the bi-directionality, whether a collector-emitter is considered a collector (e.g., current flow into the B-TRAN) or an emitter (e.g., current flow out of the B-TRAN) depends on the polarity of the applied external voltage and thus the direction of current flow through the B-TRAN. Consider, as an example, current flow through a B-TRAN device in a particular direction, such as from an upper collector-emitter to a lower collector-emitter. In such a situation, the upper collector-emitter acts a collector, and the lower collector-emitter acts as an emitter.

SUMMARY

At least one example is a method of operating a power module having bi-directional double-base bipolar junction transistor, the method comprising: conducting a first load current from an upper terminal of the power module to an upper collector-emitter of the transistor, through the transistor, and from a lower collector-emitter to a lower terminal of the power module; and then responsive assertion of a first interrupt signal interrupting the first load current from the lower collector-emitter to the lower terminal by opening a lower-main FET and thereby commutating a first shutoff current through a lower base of the transistor to the lower terminal; and blocking current from the upper terminal to the lower terminal by the transistor.

In the example method: interrupting the first load current may further comprise interrupting the first load current with the lower-main FET having a breakdown voltage of 100 Volts or less; and blocking current may further comprise blocking at an applied voltage across the upper terminal and the lower terminal of 600 Volts or greater.

The example method may further comprise, after blocking current from the upper terminal to the lower terminal: conducting a second load current from the lower terminal of the power module to the lower collector-emitter, through the transistor, and from the upper collector-emitter to the upper terminal; and then responsive to assertion of a second interrupt signal interrupting the second load current from the upper collector-emitter to the upper terminal by opening an upper-main FET and thereby commutating a second shutoff current through an upper base to the upper terminal; and blocking current from the lower terminal to the upper terminal by the transistor. In the example method: interrupting the second load current may further comprise interrupting the second load current with the upper-main FET having a breakdown voltage of 100 Volts or less; and blocking current from the lower terminal to the upper terminal may further comprise blocking at an applied voltage across the lower terminal and the upper terminal of 600 Volts or greater.

Another example is a switch assembly comprising: an upper terminal, a lower terminal, and an upper-control input; a transistor defining an upper base, an upper collector-emitter, a lower base, and a lower collector-emitter; an upper-main FET defining a first lead coupled to the upper terminal, a second lead coupled to the upper collector-emitter, and a gate; a lower-main FET defining a first lead coupled to the lower collector-emitter, a second lead coupled to the lower terminal, and a gate; and a controller coupled to the upper-control input, the gate of the upper-main FET and the gate of the lower-main FET, and for a first applied voltage across the upper terminal and lower terminal. The controller may be configured to: assert the gate of the upper-main FET to make the upper-main FET conductive, arrange the transistor for conduction from the upper collector-emitter to the lower collector-emitter, and assert the gate of the lower-main FET to make the lower-main FET conductive such that a first load current flows from the upper terminal to the lower terminal; sense de-assertion of the upper-control input; and responsive to de-assertion of the upper-control input de-assert the gate of the lower-main FET to interrupt the first load current and thereby commutate a first shutoff current through the lower base to the lower terminal; and arrange the transistor to block current flow from the upper terminal to the lower terminal.

In the example switch assembly, the breakdown voltage of the transistor may be is 600 Volts or greater, and the breakdown voltage of the lower-main FET may be 100 Volts or less.

In the example switch assembly, the breakdown voltage of the transistor may be about 1200 Volts, and the breakdown voltage of the lower-main FET may be 80 Volts or less.

The example switch assembly may further comprise an upper-base FET having a first lead coupled to the upper base, a second lead coupled to the upper terminal, and a gate, and during periods when the first load current flows from the upper terminal to the lower terminal, the upper-base FET is conductive. And when the controller arranges the transistor to block current flow from the upper terminal to the lower terminal, the controller may be further configured to de-assert the gate of the upper-base FET to electrically float the upper base.

The example switch assembly may further comprise a lower-control input coupled to the controller. And for a second applied voltage across the upper terminal and lower terminal, the second applied voltage having a polarity opposite the first applied voltage, the controller may be further configured to: assert the gate of the lower-main FET to make the lower-main FET conductive, arrange the transistor for conduction from the lower collector-emitter to the upper collector-emitter, and assert the gate of the upper-main FET to make the upper-main FET conductive such that a second load current flows from the lower terminal to the upper terminal; sense de-assertion of the lower-control input; and responsive to de-assertion of the lower-control input de-assert the gate of the upper-main FET to interrupt the second load current and thereby commutate a second shutoff current through the upper base to the upper terminal; and arrange the transistor to block current flow from the lower terminal to the upper terminal. The example switch assembly may further comprise a lower-base FET having a first lead coupled to the lower base, a second lead coupled to the lower terminal, and a gate, and during periods when the second load current flows from the upper terminal to the lower terminal, the lower-base FET is conductive. And when the controller arranges the transistor to block current flow from the lower collector-emitter to the upper collector-emitter, the controller may be further configured to de-assert the gate of the lower-base FET to electrically float the lower base. The breakdown voltage of the transistor may be 600 Volts or greater, and the breakdown voltage of the lower-main FET may be 100 Volts or less.

Another example is a method of operating a bi-directional double-base bipolar junction transistor, the method comprising: making the transistor conductive from an upper collector-emitter to a lower collector-emitter by supplying current to an upper base of the transistor and electrically floating a lower base of the transistor; and then making the transistor non-conductive by electrically floating the upper base, electrically floating the lower collector-emitter, and conducting a shutoff current through the lower base of the transistor.

In the example method, electrically floating the lower collector-emitter may further comprise making non-conductive a lower-main electrically-controlled switch having a first lead coupled to the lower collector-emitter.

In the example method, making the transistor conductive may further comprise: closing an upper-main electrically-controlled switch coupled between an upper terminal and the upper collector-emitter; and closing a lower-main electrically-controlled switch coupled between a lower conductor terminal and the lower collector-emitter. Making the transistor non-conductive may further comprise: opening the upper-main electrically-controlled switch; conducting the shutoff current to the upper collector-emitter through a diode associated with the upper-main electrically-controlled switch; and commutating the shutoff current from the lower collector-emitter to the lower base by opening the lower-main electrically-controlled switch.

In the example method, conducting the shutoff current through the lower base may further comprise conducting current through a diode associated with an electrically-controlled switch having a first lead coupled to the lower base.

In the example method, supplying current to the upper base may further comprise at least one selected from a group comprising: supplying current at a base voltage about the same as a collector voltage applied to the upper collector-emitter; and supplying current to the upper base at the base voltage higher than the collector voltage.

BRIEF DESCRIPTION OF THE DRAWINGS

For a detailed description of example embodiments, reference will now be made to the accompanying drawings in which.

DEFINITIONS

Figure 1:
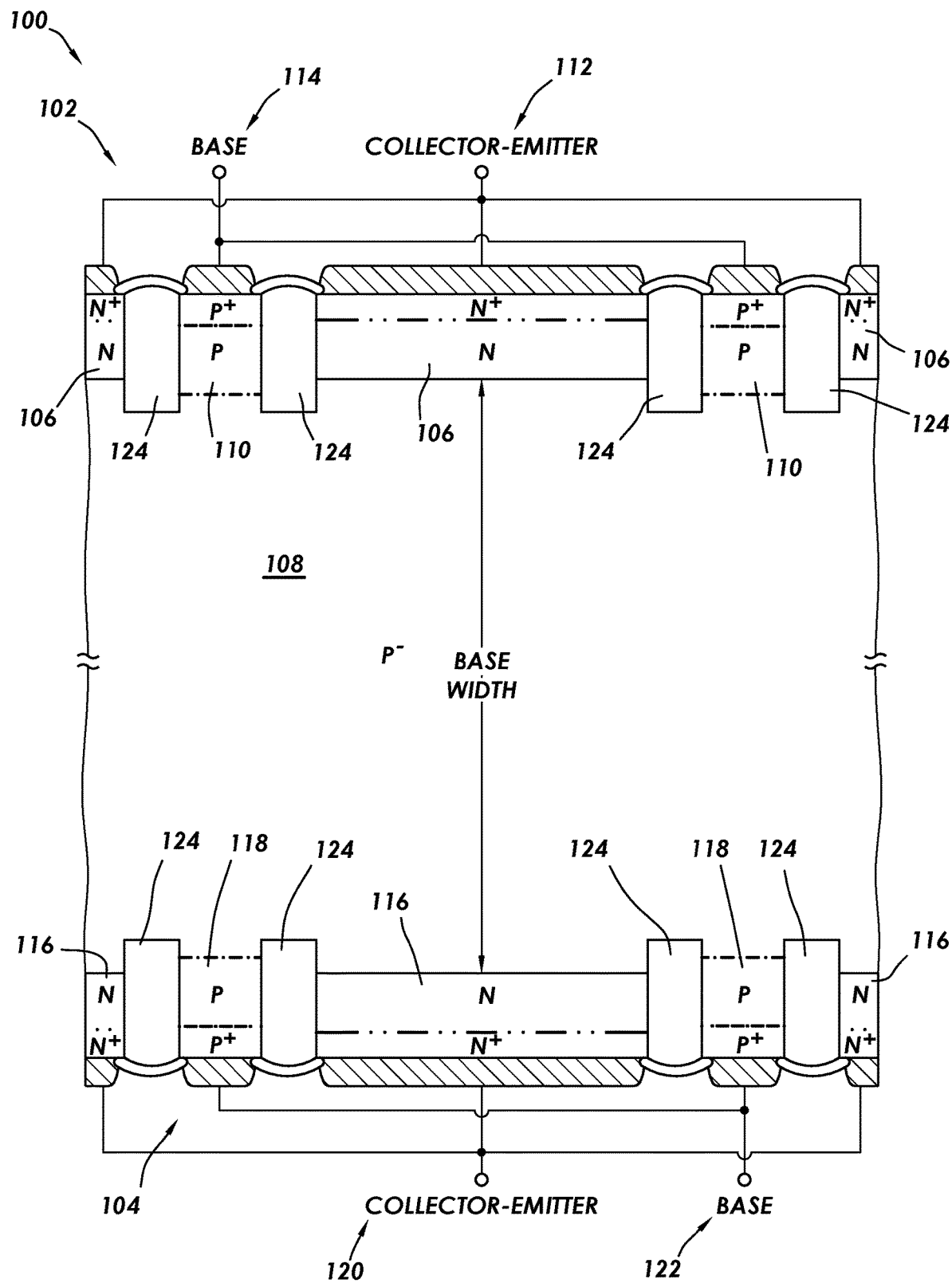
FIG. 1 shows a cross-sectional elevation view of a B-TRAN in accordance with at least some embodiments.

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct connection. Thus, if a first device couples to a second device, that connection may be through a direct connection or through an indirect connection via other devices and connections.

"About" in reference to a recited parameter shall mean the recited parameter plus or minus ten percent (+/−10%) of the recited parameter.

"Assert" shall mean changing the state of a Boolean signal. Boolean signals may be asserted high or with a higher voltage, and Boolean signals may be asserted low or with a lower voltage, at the discretion of the circuit designer. Similarly, "de-assert" shall mean changing the state of the Boolean signal to a voltage level opposite the asserted state.

"Bi-directional double-base bipolar junction transistor" shall mean a junction transistor having a base and a collector-emitter on a first face or first side of a bulk region, and having a base and a collector-emitter on a second face or second side of the bulk region. The base and the collector-emitter on the first side are distinct from the base and the collector-emitter on the second side.

"FET" shall mean a field effect transistor, such as a junction-gate FET (JFET) or metal-oxide-silicon FET (MOSFET).

"Closing" in reference to an electrically-controlled switch (e.g., a FET) shall mean making the electrically-controlled switch conductive. For example, closing a FET used as an electrically-controlled switch may mean driving the FET to the fully conductive state.

"Opening" in reference to an electrically-controlled switch (e.g., a FET) shall mean making the electrically-controlled switch non-conductive.

"Upper base" shall mean a base of a bi-directional double-base bipolar junction transistor on a first side of a bulk region of the transistor, and shall not be read to imply a location of the base with respect to gravity.

"Lower base" shall mean a base of a bi-directional double-base bipolar junction transistor on a second side of a bulk region of the transistor opposite a first side, and shall not be read to imply a location of the base with respect to gravity.

"Upper collector-emitter" shall mean a collector-emitter of a bi-directional double-base bipolar junction transistor on a first side of a bulk region of the transistor, and shall not be read to imply a location of the base with respect to gravity.

"Lower collector-emitter" shall mean a collector-emitter of a bi-directional double-base bipolar junction transistor on a second side of a bulk region of the transistor opposite a first side, and shall not be read to imply a location of the base with respect to gravity.

"Injecting charge carries into [a base]" or "injection of charge carriers into [a base]" (e.g., upper base, lower base) of a transistor shall not include directly coupling (e.g., through a transistor) the base to a collector-emitter on the same side of the transistor.

"Extracting charge carries from [a base]" or "extraction of charge carriers from [a base]" (e.g., upper base, lower base) of a transistor shall not include directly coupling (e.g., through a transistor) the base to a collector-emitter on the same side of the transistor.

The terms "input" and "output" when used as nouns refer to connections (e.g., electrical, software), and shall not be read as verbs requiring action. For example, a timer circuit may define a clock output. The example timer circuit may create or drive a clock signal on the clock output. In systems implemented directly in hardware (e.g., on a semiconductor substrate), these "inputs" and "outputs" define electrical connections. In systems implemented in software, these "inputs" and "outputs" define parameters read by or written by, respectively, the instructions implementing the function.

"Controller" shall mean, alone or in combination, individual circuit components, an application specific integrated circuit (ASIC), a microcontroller with controlling software, a reduced-instruction-set computing (RISC), a digital signal processor (DSP), a processor with controlling software, a programmable logic device (PLD), or a field programmable gate array (FPGA), configured to read inputs and drive outputs responsive to the inputs.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Various examples are directed to methods and systems of operating a bi-directional double-base bipolar junction transistor (B-TRAN). In particular, various examples are directed to operating a B-TRAN in such a way that the reductions in breakdown voltage between the upper collector-emitter and the lower collector-emitter (and vice versa) caused by the Beta effect are reduced or eliminated, and shutoff time is reduced compared to three-terminal transistor turnoff. More particularly, during a transistor-on mode the B-TRAN conducts load current, for example, from an upper collector-emitter to a lower collector-emitter, and responsive to a control signal changing state the load current is initially interrupted by a lower-main FET having a breakdown voltage lower than the blocking voltage of the B-TRAN. Interrupting the load current commutates a portion of the load current (the commutated portion termed a shutoff current) through the B-TRAN to the lower base. The shutoff current reverse biases a PN junction between the upper collector-emitter and the lower base, which thus quickly blocks current flow through the B-TRAN. Thereafter, the applied voltage is blocked by the B-TRAN. Load currents in the opposite direction (e.g., from the lower collector-emitter to the upper collector-emitter) caused by an applied voltage of opposite polarity may be similarly initially interrupted by an upper-main FET, and then blocked by the B-TRAN. The specification first turns to an example B-TRAN to orient the reader.

FIG. 1 shows a cross-sectional elevation view of an example B-TRAN. In particular, FIG. 1 shows a B-TRAN 100 having an upper face or upper side 102 and a lower face or lower side 104. The designations "upper" and "lower" are arbitrary and used merely for convenience of the discussion. The upper side 102 faces a direction opposite the lower side 104. Stated differently, an outward pointing vector normal to the upper side 102 (the vector not specifically shown) points an opposite direction with respect to an outward pointing vector normal to the lower side 104 (the vector not specifically shown).

The upper side 102 includes collector-emitter contact regions 106 which form a junction with the drift region or bulk substrate 108. The upper side 102 further defines base contact regions 110 disposed between the collector-emitter contact regions 106. The collector-emitter contact regions 106 are coupled together to form an upper collector-emitter 112. The base contact regions 110 are coupled together to form an upper base 114. Similarly, the lower side 104 includes collector-emitter contact regions 116 which form a junction with the bulk substrate 108. The lower side 104 further defines base contact regions 118 disposed between the lower collector-emitter contact regions 116. The collector-emitter contact regions 116 are coupled together to form a lower collector-emitter 120. The lower base contact regions 118 are coupled together to form a lower base 122.

The example B-TRAN 100 is an NPN structure, so the collector-emitter contact regions 106 and 116 are N-type, and the base contact regions 110 and 118 are P-type. In the example system, a shallow N+ region provides ohmic contact from collector-emitter contact regions 106 and 116 to the respective collector-emitters 112 and 120. Further in the example system, shallow P+contact doping provides ohmic contact from base contact regions 110 and 118 to the respective bases 114 and 122. In this example, optional dielectric-filled trenches 124 provide lateral separation between base contact regions and collector-emitter contact regions. Note that PNP-type B-TRAN devices are also contemplated; however, so as not to unduly lengthen the discussion a PNP-type B-TRAN device is not specifically shown.

In example cases, the various structures and doping associated with the upper side 102 are meant to be mirror images of the various structures and doping associated with the lower side 104. However, in some cases the various structures and doping associated with the upper side 102 are constructed at different times than the various structures and doping on the lower side 104, and thus there may be slight differences in the structures and doping as between the two sides, the differences attributable to manufacturing tolerances, but such does not adversely affect the operation of the device as a bi-directional double-base bipolar junction transistor. In order to describe operation of the example B-TRAN device, the specification now turns to a model of the B-TRAN device, along with a simplified driver circuits.

Figure 2:
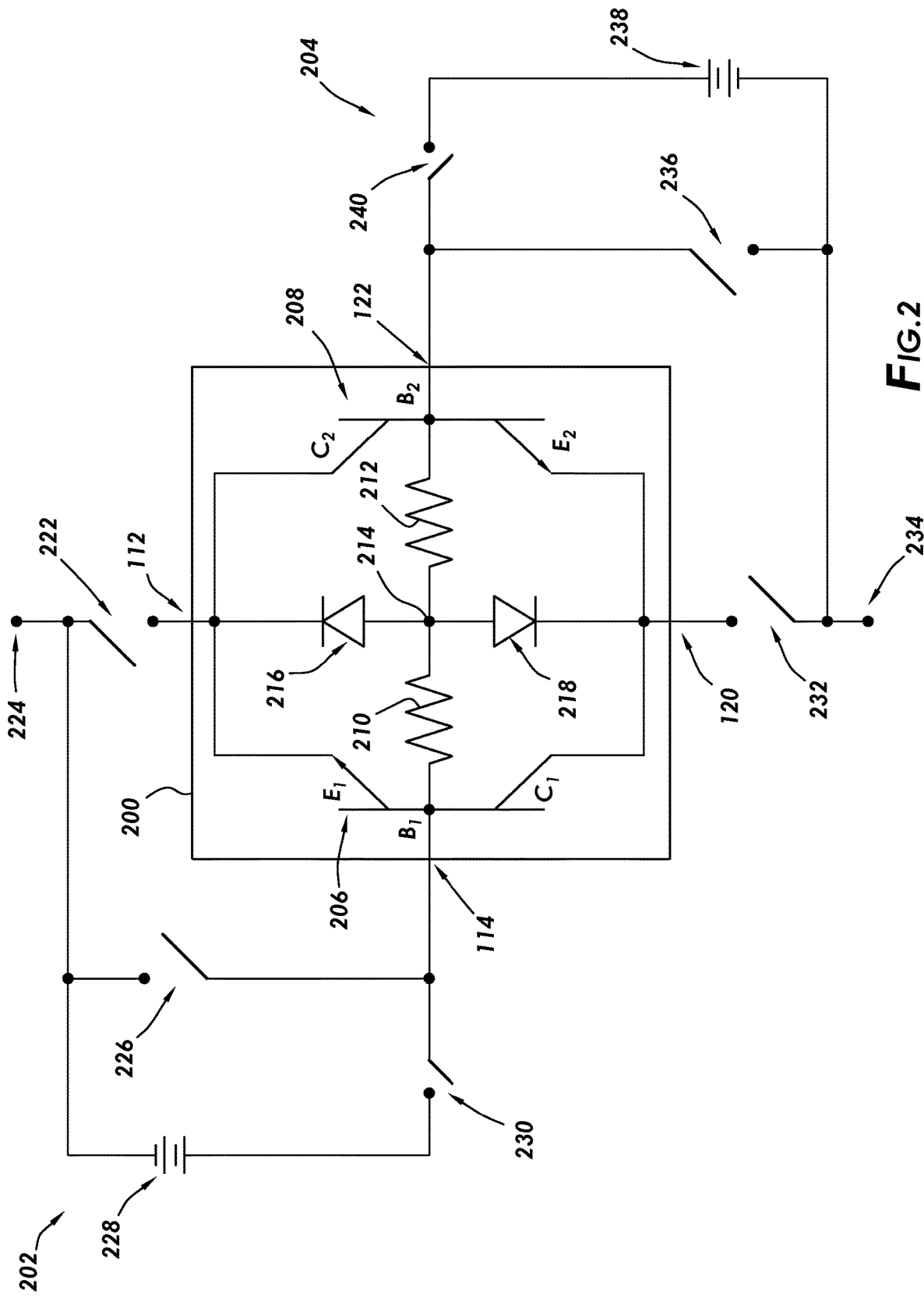
FIG. 2 shows an electrical schematic of an example switch assembly comprising a model of a B-TRAN along with conceptual driver circuits, in accordance with at least some embodiments.

FIG. 2 shows an electrical schematic of an example switch assembly comprising a model of a B-TRAN, along with a simplified electrical schematic of conceptual driver circuits. In particular, FIG. 2 shows a model 200 of a B-TRAN, along with a driver portion 202 for the upper side of the B-TRAN and a driver portion 204 for the lower side of the B-TRAN. Turning first to the model 200, the example model 200 defines the upper collector-emitter 112 and the upper base 114 (though in FIG. 2 the upper base 114 is shown on the left side). The driver portion 202 is coupled to the upper collector-emitter 112 and upper base 114. The example model 200 further defines the lower collector-emitter 120 and the lower base 122 (though in FIG. 2 the lower base 122 is shown on the right side). The driver portion 204 is coupled to the lower collector-emitter 120 and lower base 122.

Internally, the example model 200 comprises a first NPN transistor 206 having an emitter E1 coupled to the upper collector-emitter 112, a collector C1 coupled to the lower collector-emitter 120, and a base B1 defining the upper base 114. The example model 200 further includes a second NPN transistor 208 having an emitter E2 coupled to the lower collector-emitter 120, a collector C2 coupled to the upper collector-emitter 112, and a base B2 defining the lower base 122. The bases B1 and B2 are coupled together by series resistors 210 and 212 representing the drift region of the bulk substrate, and the series resistors 210 and 212 defining a node 214 between them. A diode 216 is coupled between the node 214 and the upper collector-emitter 112, and the diode 216 represents the PN junction between the upper collector-emitter 112 and the lower base 122. Similarly, a diode 218 is coupled between the node 214 and the lower collector-emitter 120, and the diode 218 represents the PN junction between the lower collector-emitter 120 and the upper base 114.

External to the model 200, and referring initially to the upper driver portion 202, an electrically-controlled switch 222 (hereafter the upper-main switch 222) has a first lead coupled to the upper collector-emitter 112 and a second lead coupled to and defining an upper terminal 224. The example upper-main switch 222 is shown as a single-pole, single-throw switch in the open or non-conductive configuration, but in practice the upper-main switch 222 may be a FET. Thus, when the upper-main switch 222 is conductive, the upper collector-emitter 112 is coupled to the upper terminal 224. Another electrically-controlled switch 226 (hereafter just switch 226) has a first lead coupled to the upper terminal 224 and a second lead coupled to the upper base 114. The example switch 226 is shown as a single-pole, single-throw switch in the open or non-conductive configuration, but in practice the switch 226 may be a FET. Thus, when the switch 226 is conductive, the upper base 114 is coupled to the upper terminal 224. The example driver portion 202 further comprises a source of charge carriers 228 illustratively shown as a battery. The source of charge carriers 228 has a negative lead coupled to the upper terminal 224. Another electrically-controlled switch 230 (hereafter just switch 230) has a first lead coupled to the positive terminal of the source of charge carriers 228, and a second lead coupled to the upper base 114. The example switch 230 is shown as a single-pole, single-throw switch, but in practice the switch 230 may be a FET. Thus, when the switch 230 is conductive, the source of charge carriers 228 is coupled between the upper terminal 224 and the upper base 114.

Now referring to the lower driver portion 204, an electrically-controlled switch 232 (hereafter the lower-main switch 232) has a first lead coupled to the lower collector-emitter 120 and a second lead coupled to and defining a lower terminal 234. The example lower-main switch 232 is shown as a single-pole, single-throw switch in the open or non-conductive configuration, but in practice the lower-main switch 232 may be a FET. Thus, when the lower-main switch 232 is conductive, the lower collector-emitter 120 is coupled to the lower terminal 234. Another electrically-controlled switch 236 (hereafter just switch 236) has a first lead coupled to the lower terminal 234 and a second lead coupled to the lower base 122. The example switch 236 is shown as a single-pole, single-throw switch in the open or non-conductive configuration, but in practice the switch 236 may be a FET. Thus, when the switch 236 is conductive, the lower base 122 is coupled to the lower terminal 234. The example driver portion 204 further comprises a source of charge carriers 238 illustratively shown as a battery. The source of charge carriers 238 has a negative lead coupled to the lower terminal 234. Another electrically-controlled switch 240 (hereafter just switch 240) has a first lead coupled to the positive terminal of the source of charge carriers 238, and a second lead coupled to the lower base 122. The example switch 240 is shown as a single-pole, single-throw switch, but in practice the switch 240 may be a FET. Thus, when the switch 240 is conductive, the source of charge carriers 238 is coupled between the lower terminal 234 and the lower base 122.

Figure 3:
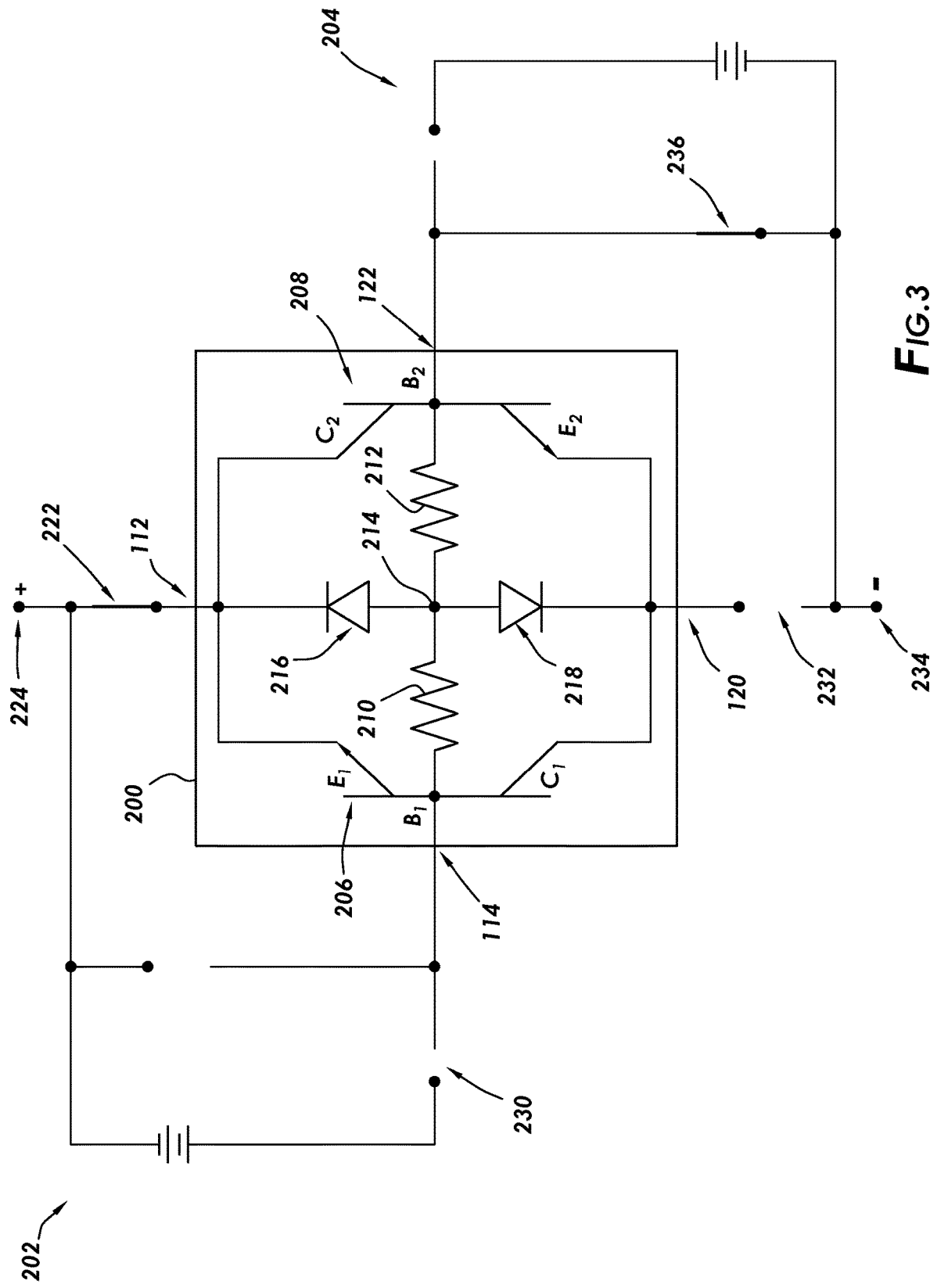
FIG. 3 shows the example switch assembly in which the B-TRAN is non-conductive, in accordance with example embodiments.

FIG. 3 shows the example switch assembly in a mode in which the B-TRAN is non-conductive and blocking current flow. The switches that are non-conductive are shown as open circuits, and the switches that are conductive are shown as electrical shorts. In particular, consider an external applied voltage across the upper terminal 224 and lower terminal 234 with the positive polarity on the upper terminal 224. In the configuration shown in FIG. 3, the upper-main switch 222 is conductive along with the switch 236 in the lower driver portion 204, and all the remaining switches are non-conductive. With the upper-main switch 222 conductive, the upper terminal 224 is coupled to the upper collector-emitter 112. With the switch 236 conductive, the lower base 122 is coupled to the lower terminal 234. In the configuration shown, the PN junction shown as diode 216 of the model 200 is reversed biased. Moreover, both the lower collector-emitter 120 and the upper base 114 are electrically floated. Thus, the B-TRAN is non-conductive for the polarity of the applied voltage, there is no current flow through the B-TRAN, and thus B-TRAN is blocking the applied voltage (e.g., 1200V from the upper terminal 224 to the lower terminal 234) by way of the PN junction formed between the upper collector-emitter 112 and the lower base 122. The arrangement of FIG. 3 may therefore be referred to as the non-conductive mode or the off mode.

Figure 4:
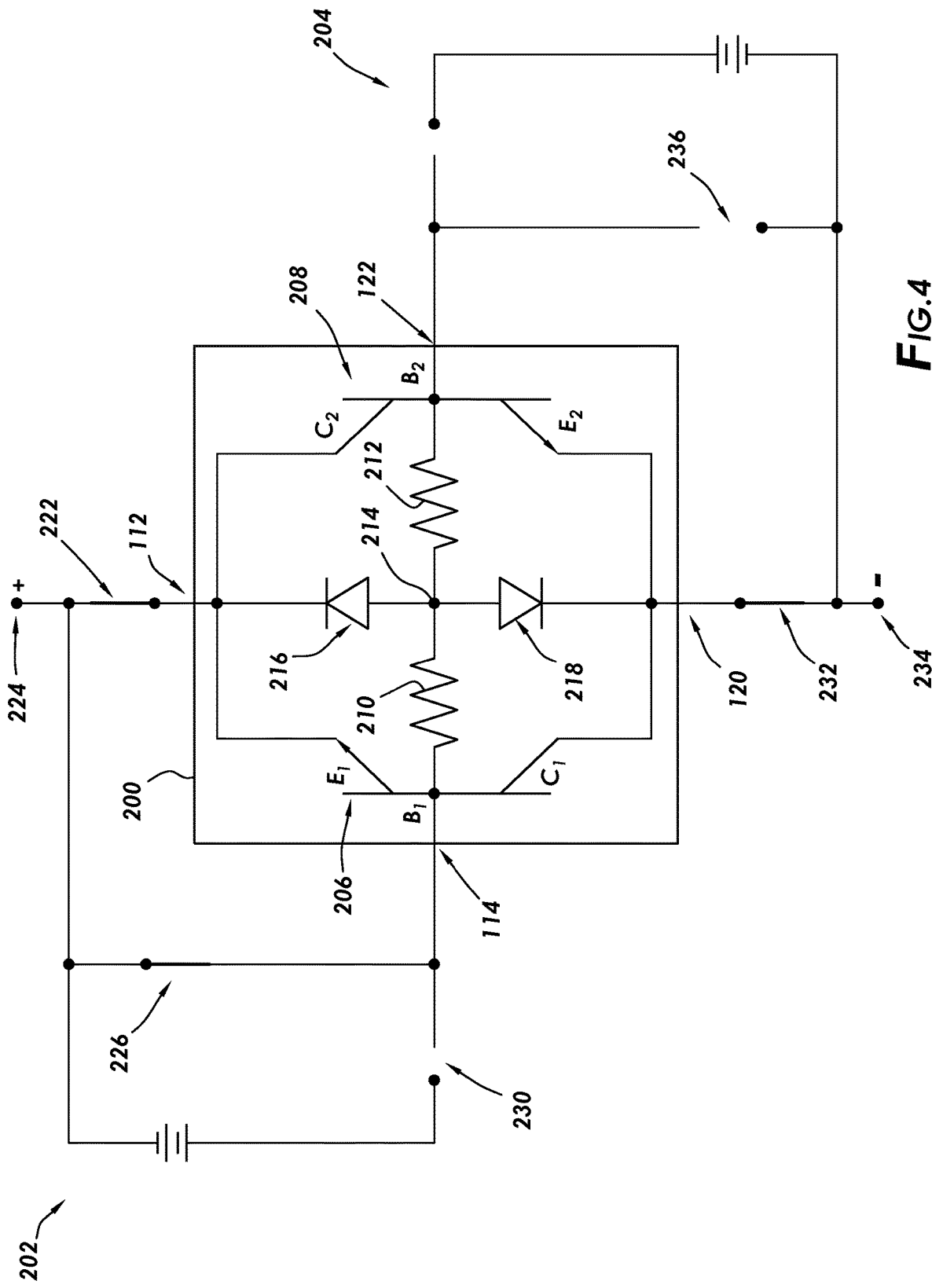
FIG. 4 shows the example switch assembly arranged for diode conduction, in accordance with at least some embodiments.

Now consider that the B-TRAN is to be made conductive. FIG. 4 shows the example switch assembly arranged for an optional diode-on mode. In particular, from the off mode of FIG. 3, in order to initially make the B-TRAN conductive with the external applied voltage in the polarity as shown, the lower-main switch 232 is made conductive, switch 226 is made conductive, and switch 236 is made non-conductive. The upper-main switch 222 may be conductive or non-conductive in the diode-on mode. In the configuration shown, the upper PN junction illustrated by diode 216 is bypassed, and the lower PN junction illustrated by diode 218 is forward biased. Thus, current flows from the upper terminal 224, through upper base 114 to the lower collector-emitter 120. When used, the diode-on mode may last predetermined period of time (e.g., about 1 microseconds (μs) to 5 μs, inclusive). In the configuration shown, the forward voltage drop is relatively low. In one example, the forward voltage drop is about 1.0V at a current density of about 200 A/cm2. However, the forward voltage drop can be lower.

Figure 5:
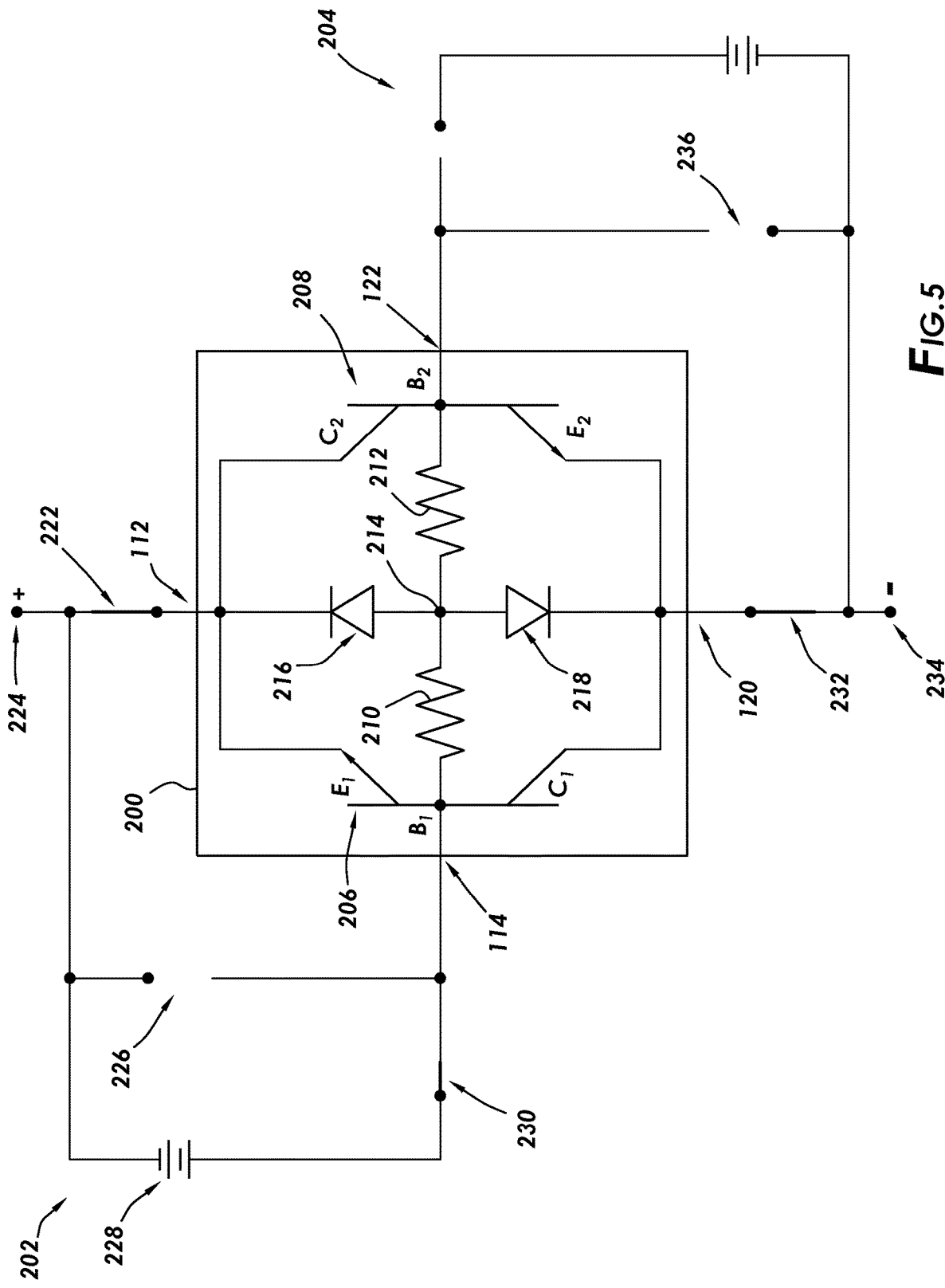
FIG. 5 shows the example switch assembly arranged for conduction, in accordance with at least some embodiments.

FIG. 5 shows the example switch assembly arranged for conduction. In cases where the diode-on mode is used, in order to further lower the forward voltage drop across the B-TRAN, switch 226 is made non-conductive, and switch 230 is made conductive. In cases where the diode-on mode is omitted, from the off mode (FIG. 3) the switch 236 is made non-conductive, the lower-main switch 232 is made conductive, the switch 230 is made conductive, and the upper-main switch 222 remains conductive. In the configuration shown, the source of charge carriers 228 is coupled between the upper terminal 224 and the upper base 114. The result is that the voltage on the upper base 114 is driven higher than the voltage on the upper collector-emitter 112. Though the lower base 122 is electrically floated, the lower base 122 is internally connected through the drift region of the B-TRAN, and thus the lower base 122 may be (depending on the example voltage of the source of charge carriers 228) driven higher than the voltage on the upper collector-emitter 112. Thus, both of the example transistors of the model 200 are partially or fully conductive, and the arrangement is termed the conductive mode or the transistor-on mode. In the configuration, charge carriers (here holes) are injected into the upper base 114 by way of the source of charge carriers 228. The additional holes in the drift region increase the conductivity of the drift region which lowers the forward voltage drop across the B-TRAN device. In one example, with an applied voltage of about 0.7V to about 1.0V, inclusive, across the upper collector-emitter 112 and upper base 114 (e.g., by the source of charge carriers 228) the forward voltage drop may be reduced to between about 0.1V and 0.2V, inclusive. The discussion now turns to related-art methods of making B-TRAN non-conductive, and potential shortcomings of the related-art methods.

Figure 6:
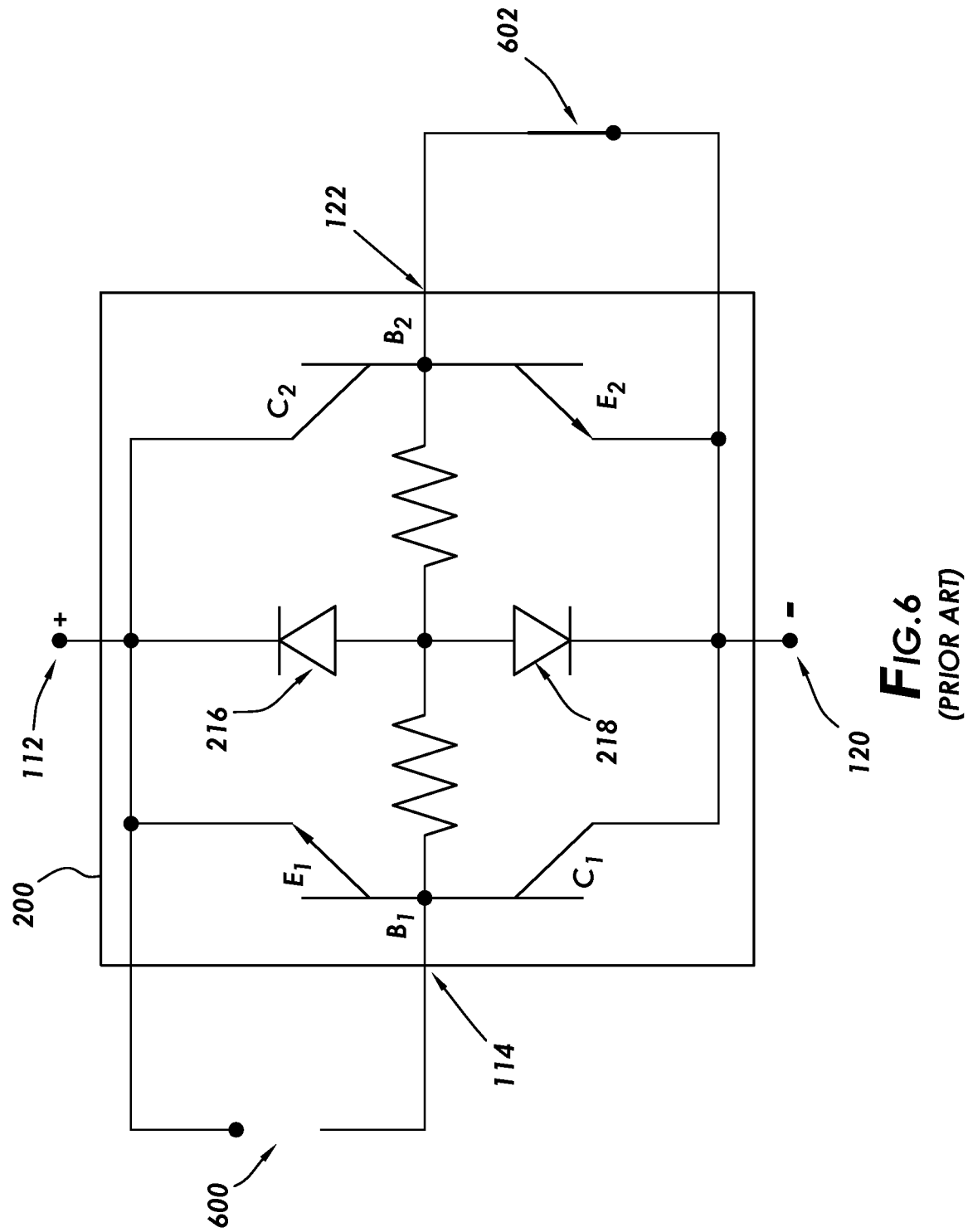
FIG. 6 shows a related switch assembly arranged for transistor turn-off.

FIG. 6 shows a related-art switch assembly arranged for transistor turn-off. In particular, FIG. 6 shows the model 200 as discussed above, as well as two external switches 600 and 602. In related-art systems, switch 600 selectively couples the upper base 114 directly to the upper collector-emitter 112, where the upper collector-emitter 112 defines the upper terminal. The switch 602 selectively couples the lower base 122 directly to the lower collector-emitter 120, where the lower collector-emitter 120 defines the lower terminal. Thus, for the example applied voltage with the polarity shown, transistor turn-off is achieved by floating the upper base 114, and directly coupling the lower base 122 to the lower collector-emitter 120. Making the B-TRAN non-conductive is thus achieved by draining charge carriers through the lower base 122 and the lower collector-emitter 120 until the upper PN junction shown as diode 216 becomes reversed biased. Making the B-TRAN non-conductive in this way may be referred to as transistor turn-off.

Transitioning the B-TRAN to transistor turn-off by way of the configuration shown is a process that may have long "tail" as the current asymptotically approaches zero, and thus takes an amount of time that is not insubstantial. That is, the amount of time to reach zero current flow through the B-TRAN using the related-art techniques may depend on the amount of load current flowing through the B-TRAN, the magnitude of the applied voltage, and how quickly charge carriers are drained from the drift region by way of the lower base 122. For example, based on simulations, transitioning from fully conductive carrying 100A of current to non-conductive may take about 6 μs using the configuration shown in FIG. 6. Various techniques may be implemented in the related-art to reduce the transition time, such as a using an arrangement in which the switches 600 and 602 are both conductive for a period of time, but while such techniques may shorten the transition time, the current "tail" is still be present in the transition.

Moreover, implementing transistor turn-off as shown by FIG. 6 in the related-art may reduce breakdown voltage. In particular, while the example switch 602 is shown as conductive and thus directly coupling the lower base 122 to the lower collector-emitter, in practice the switch 602 may be a transistor, such as a FET. Even a well designed and constructed FET will have a non-zero voltage drop (e.g., between 0.1V and 0.3V) in the fully conductive state. Additionally, the electrical connections between the B-TRAN and the external driver circuit, including switch 602, each have a small but non-zero resistance. The result is that rather than the example lower base 122 and lower collector-emitter 120 having the same potential, the lower base 122 may carry a higher potential than the lower collector-emitter 120. The higher potential on the lower base 122, in combination with the Beta of the B-TRAN, increases leakage current and lowers the breakdown voltage of the B-TRAN from the upper collector-emitter 112 to the lower collector-emitter 120. The lower breakdown voltage may be lowered further still as the temperature of the B-TRAN increases.

Further still, in many cases the example load current carried from the upper collector-emitter 112 to the lower collector-emitter 120 may be inductive in nature, either because the load itself is inductive (e.g., a motor), the inductive effects of various connections associated with the B-TRAN, or both. Related-art switch assemblies such as shown in FIG. 6 may have difficulty transitioning to non-conductive in the presence of inductive loads. Stated otherwise, the non-zero potential difference between the lower base 122 and the lower collector-emitter 120, in combination with an external inductive load, may render the B-TRAN very slow to transition to non-conductive, and in some cases for higher inductive currents may render the B-TRAN unable to transition to non-conductive.

The issues noted above are addressed, at least in part, in the example switch assemblies by the use the upper-main and lower-main switches. Returning briefly to FIG. 5, again FIG. 5 shows the example switch assembly arranged for transistor-on mode. That is, for the example polarity of the applied voltage, the load current is conducted from the upper terminal 224, through the upper-main switch 222 to the upper collector-emitter 112, through the B-TRAN, and from the lower collector-emitter 120 to the lower terminal 234 through the lower-main switch 232. In example systems, based on change of state of an interrupt signal or control signal (discussed more below), making the B-TRAN non-conductive involves interrupting the current flow by one of the upper-main or lower-main switches. With the example polarity of the applied voltage of FIG. 5, current is interrupted by the lower-main switch 232.

Returning to FIG. 3. In accordance with some examples, transitioning the switch assembly from conductive or transistor-on mode (shown in FIG. 5) to non-conductive or off mode of FIG. 3 may involve again implementing the arrangement of FIG. 3. That is, in some examples transitioning from the transistor-on mode (shown in FIG. 5) to the off mode may involve directly re-implementing the arrangement of FIG. 3. In particular, making the switch assembly non-conductive may comprise making the switch 230 non-conductive, making the lower-main switch 232 non-conductive, making switch 236 conductive, and leaving upper-main switch 222 conductive. Making the switch 230 non-conductive ceases injection of charge carriers through the upper base 114. Opening or making the lower-main switch 232 non-conductive interrupts the load current from the lower collector-emitter 120 to the lower terminal 234. Moreover, making the lower-main switch 232 non-conductive commutates a portion of the load current to flow through lower base 122 and the switch 236. The commutated portion of the load current (i.e., the shutoff current) flows for a short period of time until the PN junction illustrated as diode 216 between the upper collector-emitter 112 and the lower base 122 becomes reversed biased, and then the current drops to substantially zero. Once the PN junction shown as diode 216 is reversed biased, the example system blocks current from the upper terminal 224 to the lower terminal 234 by way of the B-TRAN. Making the B-TRAN non-conductive in this way may be referred to as a diode turn-off, which is significantly faster than transistor turn-off. In other cases, transitioning the switch assembly from conductive to non-conductive may take place by use of an optional pre-turn-off mode.

Using diode turn-off may have several advantages, though not all advantages are necessarily present in all cases. In particular, in addition to being faster than transistor turn-off, breakdown voltage of diode turn-off is higher than transistor turn-off. Furthermore, as temperature increases, breakdown voltage of a diode is increased. Moreover, under inductive loads, diode turn-off can block higher voltage and current during turn off than transistor turn-off.

Figure 7:
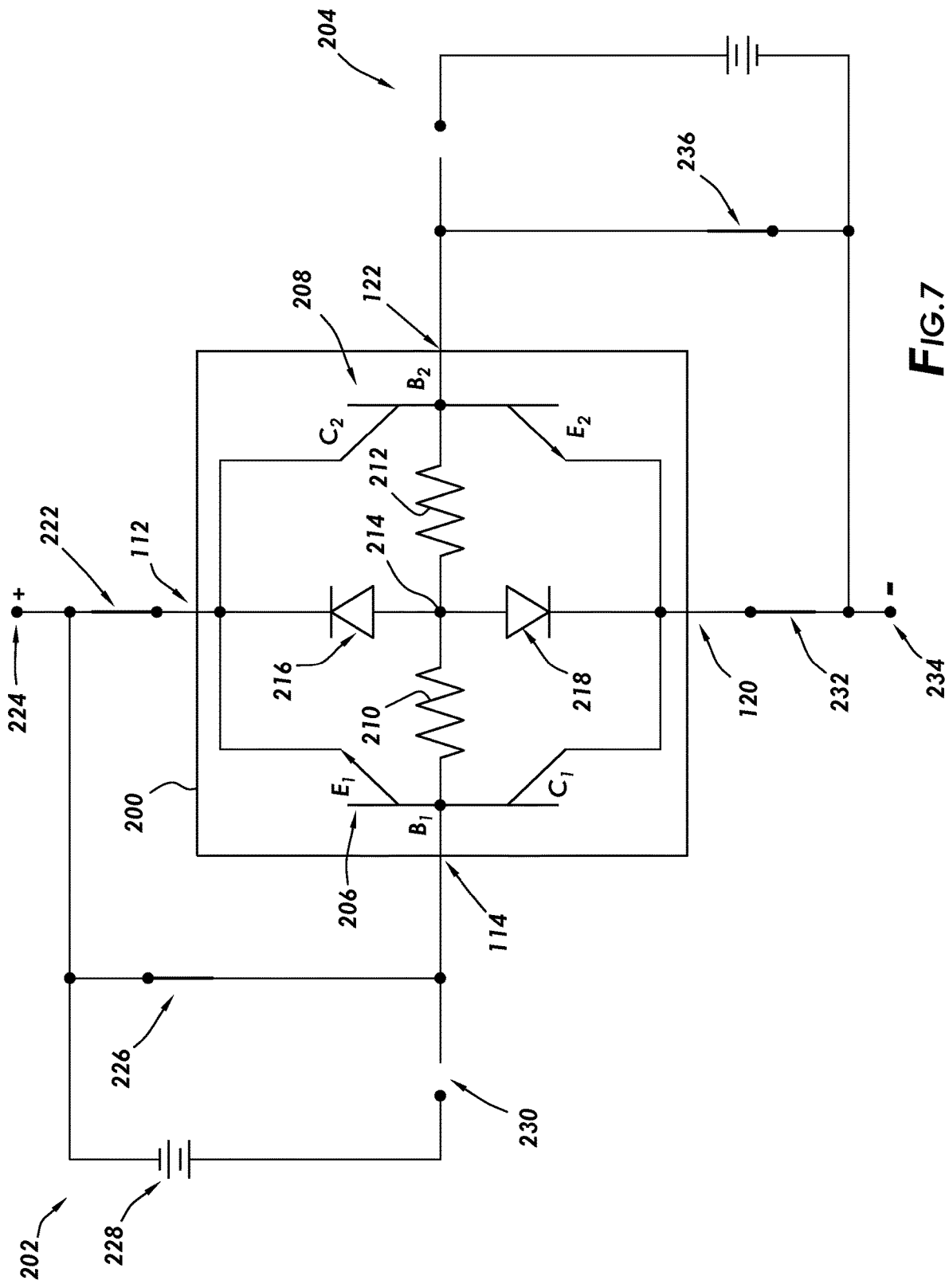
FIG. 7 shows the example switch assembly arranged for pre-turn off, in accordance with at least some embodiments.

FIG. 7 shows the example switch assembly arranged for an optional pre-turn-off mode. In some examples, the initial process of making the B-TRAN non-conductive (e.g., about 0.1 μs to 5 μs before full turn-off for a 1200V device) may involve making the switches 226 and 236 conductive, making switch 230 non-conductive, and leaving the upper-main switch 222 and lower-main switch 232 conductive. Making switch 230 non-conductive and making switch 226 conductive stops the injection of charge carriers from the source of charge carriers 228. Moreover, making switch 236 conductive causes a current drain or flow out of the drift region. It follows these actions reduce and/or remove charge carriers from the drift region, take the B-TRAN out of saturation, and increase forward voltage drop. The configuration is referred as the pre-turn-off mode. In one example, in the pre-turn-off mode the forward voltage drop from the upper collector-emitter 112 to the lower collector-emitter 120 may rise to between about 0.9V and 3V, inclusive. The example B-TRAN may then be made fully non-conductive, for the example polarity, by re-implementing the off mode of FIG. 3. Implementing the pre-turn-off mode further decrease the amount of time to transition the switch assembly to the off mode (e.g., compared to changing the arrangement of FIG. 5 to the arrangement of FIG. 3 directly).

The examples with respect to FIGS. 3-5 and 7 are for the situation of the external applied voltage having a positive polarity at the upper terminal 224. However, the example B-TRAN is a symmetrical device, and now understanding how to control current flow through the B-TRAN in with example polarity shown, control of current flow in the opposite direction directly follows. In such a situation with current flow in the opposite direction, source of charge carriers 238 and switch 240 would be used to the exclusion of source of charge carriers 228 and switch 230.

Figure 8:
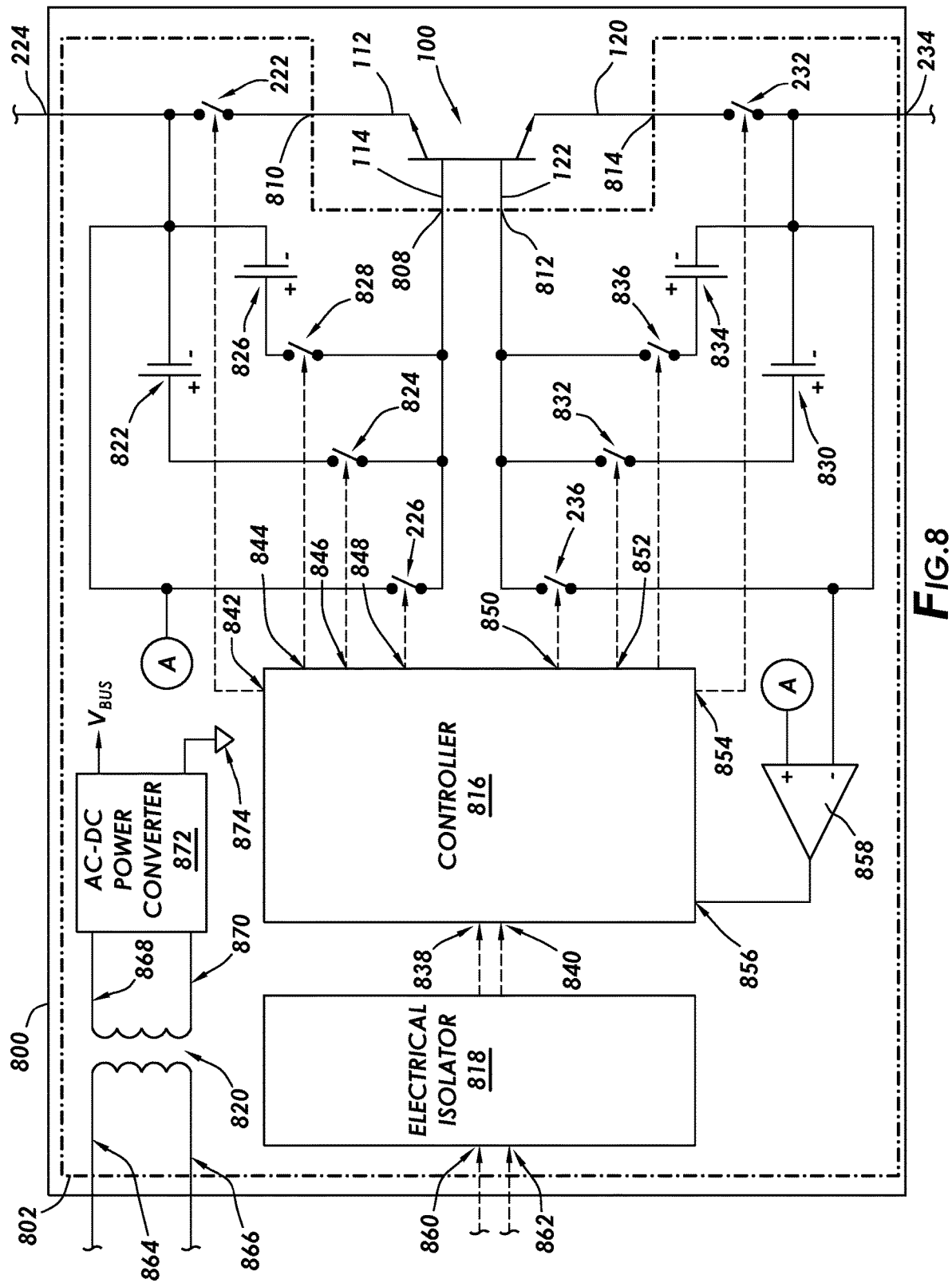
FIG. 8 shows a partial block diagram, partial electrical schematic, of a switch assembly in accordance with at least some embodiments.

FIG. 8 shows a partial block diagram, partial electrical schematic, of an example switch assembly. In particular, the example switch assembly 800 comprises a B-TRAN 100 and a driver 802. The B-TRAN 100, in an NPN configuration, is shown by way of an example circuit symbol having two emitters and two bases. The circuit symbol shows the upper collector-emitter 112, the upper base 114, the lower collector-emitter 120, and the lower base 122. The upper collector-emitter 112 is coupled to the upper terminal 224 of the switch assembly 800. The lower collector-emitter 120 is coupled to the lower terminal 234 of the switch assembly 800. The example driver 802 defines an upper-base terminal 808 coupled to the upper base 114, an upper-conduction terminal 810 coupled to the upper collector-emitter 112, a lower-base terminal 812 coupled to the lower base 122, and a lower-conduction terminal 814 coupled to the lower collector-emitter 120.

The example driver 802 further comprises a controller 816, an electrical isolator 818, and an isolation transformer 820. In order to place the B-TRAN 100 in the various conduction and non-conduction modes, the example driver 802 includes a plurality of electrically-controlled switches and sources of charge carriers. In particular, the driver 802 comprises the switch 226 that has its first lead coupled to the upper terminal 224, a second lead coupled to the upper base 114, and a control input coupled to the controller 816. As before, the example switch 226 is shown as a single-pole, single-throw switch, but in practice the switch 226 may be a FET with the control input being a gate of the FET. Thus, when the switch 226 is made conductive by assertion of its control input, the upper base 114 is coupled to the upper terminal 224.

The driver 802 further comprises a source of charge carriers 822 illustratively shown as a battery. The source of charge carriers 822 has a negative lead coupled to the upper terminal 224. Another electrically-controlled switch 824 (hereafter just switch 824) has a first lead coupled to the positive terminal of the source of charge carriers 822, a second lead coupled to the upper base 114, and a control input coupled to the controller 816. The example switch 824 is also shown as a single-pole, single-throw switch, but in practice the switch 824 may be a FET with the control input being the gate of the FET. Thus, when the switch 824 is conductive, the source of charge carriers 822 is coupled between the upper terminal 224 and the upper base 114. The driver 802 further comprises another source of charge carriers 826 illustratively shown as a battery. The source of charge carriers 826 has a negative lead coupled to the upper terminal 224. Another electrically-controlled switch 828 (hereafter just switch 828) has a first lead coupled to the positive terminal of the source of charge carriers 826, a second lead coupled to the upper base 114, and a control input coupled to the controller 816. The example switch 828 is also shown as a single-pole, single-throw switch, but in practice the switch 828 may be a FET with the control input being the gate of the FET. Thus, when the switch 828 is conductive, the source of charge carriers 826 is coupled between the upper terminal 224 and the upper base 114. The sources of charge carriers 822 and 826 may be alone or in combination the example source of charge carriers 228 of FIG. 2.

The driver 802 further comprises the upper-main switch 222 that has a first lead coupled to the upper terminal 224, a second lead defining the upper-conduction terminal 810 coupled to the upper collector-emitter 112, and a control input coupled to the controller 816. As before, the example upper-main switch 222 is shown as a single-pole, single-throw switch, but in practice the upper-main switch 222 may be a FET with the control input being a gate of the FET. Thus, when the upper-main switch 222 is made conductive, such as by assertion of its control input, the upper terminal 224 is coupled to the upper collector-emitter 112.

Turning now to lower side of the B-TRAN 100, the example driver 802 further comprises the switch 236 that has a first lead coupled to the lower terminal 234, a second lead coupled to the lower base 122, and a control input coupled to the controller 816. The example switch 236 is shown as a single-pole, single-throw switch, but in practice the switch 236 may be a FET with the control input being a gate of the FET. Thus, when the switch 236 is made conductive by assertion of its control input, the lower base 122 is coupled to the lower terminal 234.

The driver 802 further comprises a source of charge carriers 830 illustratively shown as a battery. The source of charge carriers 830 has a negative lead coupled to the lower terminal 234. Another electrically-controlled switch 832 (hereafter just switch 832) has a first lead coupled to the positive terminal of the source of charge carriers 830, a second lead coupled to the lower base 122, and a control input coupled to the controller 816. The example switch 832 is shown as a single-pole, single-throw switch, but in practice the switch 832 may be a FET with the control input being the gate of the FET. Thus, when the switch 832 is conductive, the source of charge carriers 830 is coupled between the lower terminal 234 and the lower base 122. The driver 802 further comprises another source of charge carriers 834 illustratively shown as a battery. The source of charge carriers 834 has a negative lead coupled to the lower terminal 234. Another electrically-controlled switch 836 (hereafter just switch 836) has a first lead coupled to the positive terminal of the source of charge carriers 834, a second lead coupled to the lower base 122, and a control input coupled to the controller 816. The example switch 836 is shown as a single-pole, single-throw switch, but in practice the switch 836 may be a FET with the control input being the gate of the FET. Thus, when the switch 836 is conductive, the source of charge carriers 834 is coupled between the lower terminal 234 and the lower base 122. The sources of charge carriers 830 and 834 may be alone or in combination the example source of charge carriers 238 of FIG. 2.

The driver 802 further comprises the lower-main switch 232 that has a first lead coupled to the lower terminal 234, a second lead defining the lower-conduction terminal 814 coupled to the lower collector-emitter 120, and a control input coupled to the controller 816. As before, the example lower-main switch 232 is shown as a single-pole, single-throw switch, but in practice the lower-main switch 232 may be a FET with the control input being a gate of the FET. Thus, when the lower-main switch 232 is conductive, such as by assertion of its control input, the lower terminal 234 is coupled to the lower collector-emitter 120.

The controller 816 defines control inputs 838 and 840, and control outputs 842, 844, 846, 848, 850, 852, and 854 coupled to the control inputs of the switches 222, 828, 824, 226, 236, 832, 836, and 232, respectively. When the control input 838 is asserted, the controller 816 is designed and constructed to arrange the B-TRAN 100 for conduction from the upper terminal 224 to the lower terminal 234 (e.g., FIG. 4 or 5). Oppositely, when the control input 838 is de-asserted, the controller 816 is designed and constructed to arrange the B-TRAN 100 to block current flow from the upper terminal 224 to the lower terminal 234 (e.g., the off mode of FIG. 3). Similarly, when the control input 840 is asserted, the controller 816 is designed and constructed to arrange the B-TRAN 100 for conduction from the lower terminal 234 to the upper terminal 224. And oppositely, when the control input 840 is de-asserted, the controller 816 is designed and constructed to arrange the B-TRAN 100 to block current flow from the lower terminal 234 to the upper terminal 224. When the control inputs 838 and 840 are both asserted, the controller 816 arranges the B-TRAN 100 for current flow in both directions (e.g., AC breaker service), and when the control inputs 838 and 840 are both de-asserted, the controller 816 blocks current flow in both directions.

In some cases the arrangement of the B-TRAN 100 to be in non-conductive is dependent upon the polarity of the applied voltage. Thus, the example controller 816 may further define a polarity input 856 that receives a Boolean indication of the applied polarity. In the example driver 802, a comparator 858 has a first input coupled to the upper terminal 224 (the connection shown by bubble "A") and a second input coupled to the lower terminal 234. The comparator 858 defines a compare output coupled to the polarity input 856. While FIG. 8 shows the first and second inputs coupled directly to the respective conduction terminals, in practice the voltage across the B-TRAN 100 when non-conductive may be large (e.g., 1200V) and thus each of the first and second inputs may be coupled to their respective conduction terminals by way of respective voltage divider circuits. In yet still further cases, the applied polarity may be determined by systems and devices external to the switch assembly 800, and a Boolean signal sent across the electrical isolator 818 to the control input 856.

Transitioning the B-TRAN 100 from being non-conductive, to conductive, and then back to non-conductive may be a multistep process. To implement the multistep process, the controller 816 may be individual circuit components, an application specific integrated circuit (ASIC), a microcontroller with controlling software, a reduced-instruction-set computing (RISC), a digital signal processor (DSP), a processor with controlling software, a programmable logic device (PLD), or a field programmable gate array (FPGA), and/or combinations, configured to read the control inputs 838 and 840, read the polarity input 856, and drive control outputs to implement the mode transitions of the B-TRAN 100.

In example systems, the switch assembly 800 is electrically floated. In order to receive the control inputs 838 and 840 in the electrical domain of the switch assembly 800, the example driver 802 implements the electrical isolator 818. The example electrical isolator 818 may take any suitable form, such as optocouplers or capacitive isolation devices. Regardless of the precise nature of the electrical isolator 818, external control signals (e.g., Boolean signals) may be coupled to control inputs 860 and 862 of the electrical isolator 818. The electrical isolator 818, in turn, passes the control signals through to the electrical domain of the switch assembly 800. In the example, the external control signals are passed through to become the control input 838 and 840 of the controller 816.

Turning now to the isolation transformer 820. Various devices within the switch assembly 800 may use operational power. For example, the controller 816 may use a bus voltage and power to enable implementation of the various modes of operation of the B-TRAN. Further, the sources of charge carriers within system may in practice be implemented as individual voltage sources in the form of switching power converters, or individual current sources also implemented using switching power converters. The switching power converters implementing the sources of charge carriers may use bus voltage and power. In order to provide operational power within the electrical domain of the switch assembly 800, the isolation transformer 820 is provided. External systems (not specifically shown) may provide an alternating current (AC) signal across the primary leads 864 and 866 of the isolation transformer 820 (e.g., 15V AC). The isolation transformer 820 creates an AC voltage on the secondary leads 868 and 870. The AC voltage on the secondary of the isolation transformer 820 may be provided to an AC-DC power converter 872, which rectifies the AC voltage and provides power by way of bus voltage VBUS (e.g., 3.3V, 5V, 12V) with respect to a common 874. The power provided by the AC-DC power converter 872 may be used by the various components of the switch assembly 800. In other cases, multiple isolation transformers may be present (e.g., one for each side of the B-TRAN). Further still, a single isolation transformer with multiple secondary windings may be used. The discussion now turns to example arrangements for making the B-TRAN 100 conductive and/or non-conductive in the context of the switch assembly 800.

Consider, as an example, a situation in which the applied voltage has the positive polarity on the upper terminal 224. Further consider that the control input 860 applied to the electrical isolator 818 is de-asserted, and thus a control signal applied to the control input 838 of the controller 816 is de-asserted. Based on the de-asserted state of the control input 838, the controller 816 is designed and constructed to place the B-TRAN 100 in the off mode taking into account the applied polarity (e.g., as read by the controller 816 through the polarity input 856). Thus, in the example arrangement the upper-main switch 222 is conductive and the switch 236 is conductive. In some examples switches 222 and 236 are made conductive by the controller 816 asserting the control outputs 842 and 850, respectively. However, in other cases, and as described in greater detail below, the switches 222 and 236 are implemented as FETs with internal body diodes. Thus, the conductivity of upper-main switch 222 may be based, initially at least, on the applied voltage forward biasing the body diode of the FET implementing the upper-main switch 222. Similarly, the conductivity of switch 236 may be based, initially at least, on the applied voltage forward biasing the body diode of the FET implementing the switch 236. It follows the controller 816 need not necessarily take affirmative action to achieve the current blocking for the assumed polarity of the voltage applied. A similar arrangement and/or operation may exist for the lower-main switch 232 and the switch 226 when arranged for blocking current for the opposite polarity.

Still considering the example arrangement of the positive polarity at the upper terminal 224, now consider that the control signal applied to the control input 860 of the electrical isolator 818 is asserted, and thus the control signal applied to the control input 838 of the controller 816 is asserted. Based on the assertion, in the example switch assembly 800 the controller 816 may be designed and constructed to first place the B-TRAN 100 into the optional diode-on mode by asserting the control output 842 (making the upper-main switch 222 conductive), asserting the control output 854 (making the lower-main switch 232 conductive), de-asserting the control output 850 (making the switch 236 non-conductive), and asserting control output 848 (making the switch 226 conductive). Making the switch 226 conductive couples the upper terminal 224 to the upper base 114. The arrangement results in a current flow through the B-TRAN 100 and forward voltage drop commensurate the diode-on mode. When used, the diode-on mode may last a predetermined period (e.g., from about 0.1 μs to 5 μs). The controller 816 may be designed and constructed to then place the B-TRAN into the transistor-on mode by injecting charge carriers into the upper base 114. In the transition from the diode-on mode to transistor-on mode, the controller 816 may be designed and constructed to de-assert the control output 848 (making the switch 226 non-conductive) and after a sufficient amount of time to ensure the switch 226 is non-conductive, assert the control output 846 (making switch 824 conductive). In the absence of implementing the diode-on mode (i.e., from the off mode of FIG. 3), the controller 816 may be designed and constructed to assert the control output 842 (making the upper-main switch 222 conductive), assert the control output 854 (making the lower-main switch 232 conductive), de-assert the control output 850 (making switch 236 non-conductive), and assert the control output 846 (making switch 824 conductive). Regardless, making switch 824 conductive couples the source of charge carriers 822 between the upper collector-emitter 112 and the upper base 114. In some example systems, the source of charge carriers 822 creates a controlled voltage applied across the upper collector-emitter 112 and the upper base 114 of about 1.0V, which results in current flow into the upper base 114. In the arrangement the injecting of charge carriers into the upper base 114 increases the number of charge carriers in the drift region of the B-TRAN 100, which drives the B-TRAN 100 into a saturated state.

The second source of charge carriers 826 and related switch 828 may be used to perform different functions in different switch assemblies 800. For example, the voltage produced by the source of charge carriers 826 may be higher than the voltage produced by the source of charge carriers 822, and thus to decrease switching time from non-conductive to fully conductive, the source of charge carriers 826 may be coupled to the upper base 114 for a predetermined period of time, and thereafter the injection of charge carriers may transition to the source of charge carriers 822 for reasons of increasing overall efficiency (e.g., taking into account energy used by the switch assembly 800).

In yet still other cases, the voltage produced by the source of charge carriers 826 may be lower than the voltage produced by the source of charge carriers 822, and in order to reduce switching losses associated with moving from conductive to non-conductive, a predetermined time before the next transition the example switch assembly 800 may transition to injection of charge carriers using the source of charge carriers 826 which may increase the forward voltage drop across the B-TRAN 100 but which may decrease switching losses at the next transition.

The example operation discussed with respect to FIG. 8 was for the example applied voltage with the positive polarity on the upper terminal 224. Again, however, the example B-TRAN 100 is a symmetrical device, and now understanding how to arrange the B-TRAN 100 into the various conductive and non-conductive states, control of current flow in the opposite direction directly follows.

The switch assembly 800 of FIG. 8 utilizes separate and independent sources of charge carriers associated with each side for the two injection modes for charge carriers. For example, the upper side illustratively uses the source of charge carriers 822 and source of charge carriers 826, and the lower side illustratively uses the source of charge carriers 830 and 834. However, in other cases each side of the B-TRAN 100 may use a single yet variable source of charge carriers, one each on each side, to drive inject carriers.

Figure 9:
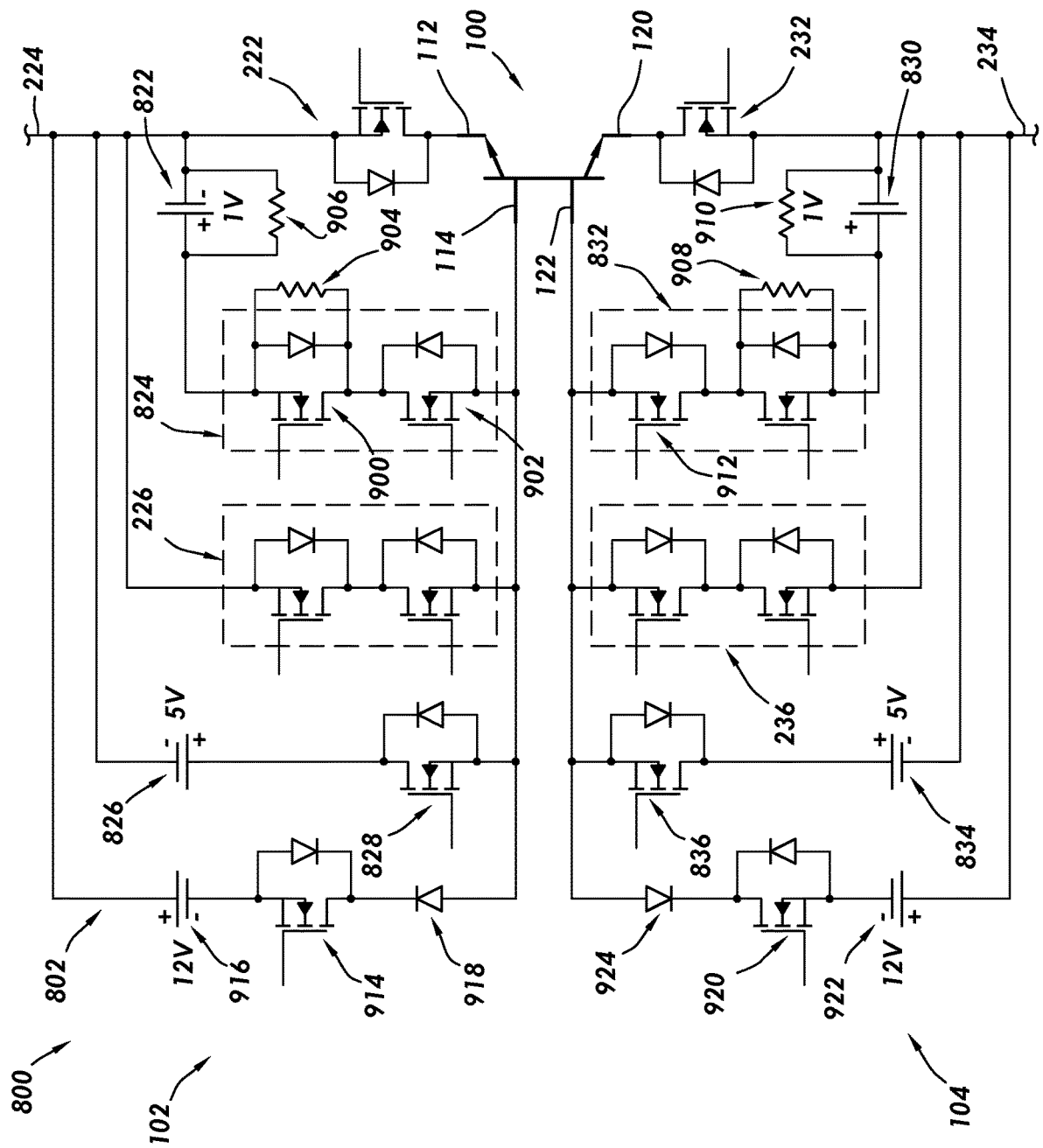
FIG. 9 shows a partial electrical schematic of a switch assembly in accordance with at least some embodiments.

FIG. 9 shows a partial electrical schematic of an example switch assembly. In particular, FIG. 9 shows the example B-TRAN 100 as well as portions of an example driver 802. The driver 802 may likewise have the isolation transformer, the AC-DC power converter, the electrical isolator, the controller, and the comparator, but those components are omitted from the shorthand notation of FIG. 9. For purposes of discussion, for the upper side 102, FIG. 9 shows the switches 222, 824, 226, and 828, as well as the example sources of charge carriers 822 and 826. For the lower side 104, FIG. 9 shows the switches 232, 832, 236, and 836, as well as the example sources of charge carriers 830 and 834.

As alluded to above, many of the switches are implemented as FETs. In the example switch assembly of FIG. 9 the upper-main switch 222 is shown as a FET having a source coupled to the upper terminal 224, a drain coupled to the upper collector-emitter 112, a gate defining the control input, and a body diode coupled between the source and the drain. When the applied voltage has a positive polarity on the upper terminal 224, the body diode is forward biased and thus makes the upper-main switch 222 conductive (without action by the controller 816 (FIG. 8)). During conductive states of the B-TRAN 100, and regardless of applied polarity, the controller 816 drives the gate to make the FET conductive to lower the overall voltage drop. In example cases, the FET used to implement the upper-main switch 222 may have a breakdown voltage of 100V or less, and in some cases about 80V, in spite of the fact the B-TRAN 100 may have a breakdown voltage of 600V or more, and in some cases about 1200V.

The example switch 226 is shown as pair of back-to-back FETs. In particular, the switch 226 is shown as a first FET having a source coupled to the upper terminal 224, a second FET having a source coupled to the upper base 114, and the drains of the FETs are coupled together. The gates of the FETs may be coupled individually to the controller 816 (FIG. 8), or the gates may be coupled together and driven by the controller 816 as a single unit. The FETs each have body diodes, and in the arrangement shown the cathodes of the body diodes are coupled together. Having back-to-back FETs enables bi-directional current blocking in spite of the presence of the body diodes, as well as bi-directional current flow. For example, the switch 226 may be conductive during the optional diode-on mode (FIG. 4) in which, for positive polarity at the upper terminal 224, current may flow from the upper terminal 224 to the upper base 114 through the switch 226. During transistor-on mode, however, the switch 226 may need to be non-conductive (e.g., to enable other devices to inject charge carriers). Thus, for positive polarity on the upper terminal 224, when the gates are de-asserted the back-to-back FETs block current flow in spite of the body diode of the first FET being forward biased. In situations in which the positive polarity is at the lower terminal 234, the switch 226 may also be conductive in transitions to and during the transistor-off mode. For example, the shutoff current in the transition to the transistor-off mode may be carried by switch 226, along with any leakage current in the transistor-off mode.

Similarly, switch 824 is shown as a pair of back-to-back FETs. In particular, the switch 824 is shown as a FET 900 having a source coupled to the source of charge carriers 822, a FET 902 having a source coupled to the upper base 114, and the drains of the FETs 900 and 902 are coupled together. The gates of the FETs 900 and 902 may be coupled individually to the controller 816 (FIG. 8), or the gates may be coupled together and driven by the controller 816 as a single unit. The FETs 900 and 902 each have a body diode, and in the arrangement shown the cathodes of the body diodes are coupled together. Having back-to-back FETs enables bi-directional current blocking in spite of the presence of the body diodes, as well as bi-directional current flow. With positive polarity on the upper terminal 224, the transistor-on mode may be implemented with the source of charge carriers 822 injecting charge carriers into the upper base 114 through the FETs 900 and 902. In other modes, the current flow from the source of charge carriers 822 to the upper base 114 may be blocked by the FET 902 in spite of the fact the body diode of the FET 900 may be forward biased by the source of charge carriers 822.

In example cases, the resistors 904 and 906 enable the switch 824 to serve the functions of both the switch 226 and switch 230 (FIG. 2). That is, when the source of charge carriers 822 is used to inject charge carriers into the upper base 114, the switch 824 serves the function of switch 230. However, the FET 902 of the example switch 824, along with the resistors 904 and 906, also enable the switch 824 to serve the function of switch 226. For example, when the positive polarity is on the lower terminal 234 and the upper-main switch 222 is non-conductive, the shutoff current may flow through the body diode of the FET 902, through the resistor 904 in parallel with the FET 900, and through the resistor 906 in parallel the source of charge carriers 922. While eventually the controller 816 (FIG. 8) may make switch 226 conductive, the timing constraints are more forgiving because in the example situation the body diode of the FET 902 conducts contemporaneously with the commutation that creates the shutoff current.

Still considering switch 824 and resistors 904 and 906 (and the corresponding resistors 908 and 910 associated with switch 832 on the lower side 104), the body diodes may be used to enable a power-up safe mode. That is, the resistors 904 and 906 ensure race conditions at power up of the switch assembly 800 do not cause inadvertent conduction through the B-TRAN 100. In particular, the switch assembly 800 may have the upper terminal 224 and lower terminal 234 coupled within an overall system. Voltage may appear across the upper terminal 224 and lower terminal 234, in either polarity, before the AC-DC power converter 872 (FIG. 8) has powered up, and/or before the controller 816 has had an opportunity to bootstrap to an operational state. Consider, as an example, a power up condition in which the positive polarity appears at the upper terminal 224 before the controller 816 is operational. In such a situation, the body diode of the FET implementing the upper-main switch 222 is conductive. Moreover, the body diode of the FET 912 of the switch 832 will be forward biased, causing the shutoff current and/or leakage current to flow from the lower base 122 to the lower terminal 234. A similar arrangement occurs when the positively polarity appears on the lower terminal 234. Thus, even in the absence of control by the controller 816, the B-TRAN 100 enters a non-conductive safe mode regardless of the polarity of the voltage applied across the upper terminal 224 and lower terminal 234.

Switch 828 is shown as a single FET having a source coupled to the upper base 114, a drain coupled to the positive lead of the source of charge carriers 826, a gate defining the control input, and a body diode coupled between the source and the drain. As noted above, the source of charge carriers 826 may be used for a predetermined period of time when transitioning the B-TRAN 100 to conductive. The voltage associated with the source of charge carriers 826 may keep the body diode of the FET reversed biased when the FET itself is non-conductive, and thus back-to-back FETs may not be needed with the respect to the switch 828.

FIG. 9 further shows the lower-main switch 232 as a FET having a source coupled to the lower terminal 234, a drain coupled to the lower collector-emitter 120, a gate defining the control input, and a body diode coupled between the source and the drain. When the applied voltage has the positive polarity on the lower terminal 234, the body diode is forward biased and thus makes the lower-main switch 232 conductive (without action by the controller 816 (FIG. 8)). During conductive states of the B-TRAN 100, and regardless of applied polarity, the controller 816 drives the gate to make the FET conductive to lower the overall voltage drop. In example cases, the FET used to implement the lower-main switch 232 may have a breakdown voltage of 100V or less, and in some cases about 80V, in spite of the fact the B-TRAN 100 may have a breakdown voltage of 600V or more, and in some cases about 1200V.

In similar fashion to switch 226, switch 236 may be implemented as back-to-back FETs. Further, in similar fashion switch 832 may be implemented as back-to-back FETs. The description of operation of switches 236 and 832 are duplicative of the descriptions of switches 226 and 824, taking into account the polarity of the applied voltage, and will not be repeated again here so as not to unduly lengthen the description. Similarly, the source of charge carriers 834 may be associated with switch 836 illustratively shown as a single FET for the same reasons as discussed with respect to switch 828.

When the various switches are implemented as FETs with body diodes as shown in FIG. 9, state transitions may be more easily and quickly implemented by the controller 816 (FIG. 8). Consider, as an example, that the positive polarity is on the upper terminal 224 and that driver 802 has the B-TRAN 100 arranged for transistor-on mode. In such a situation, the upper-main switch 222 is conductive, the switch 824 is conductive, the lower-main switch 232 is conductive, and the remaining switches are non-conductive. Now consider that driver 802 receives a command to make the B-TRAN 100 non-conductive (e.g., de-assertion of control input 838 (FIG. 8)). When the switches are implemented as FETs as shown, arranging the driver 802 to implement transistor-off mode may involve having the controller 816 (FIG. 8) de-assert all the gates of all the FETs. Upper-main switch 222 will remain conductive based on the body diode being forward biased and conductive. The lower-main switch 232 interrupts the current flow and its body diode is reverse biased. While the lower-main switch 232 is used to interrupt the current flow (e.g., 100A), the lower-main switch 232 is not the primary device blocking the higher voltage—the B-TRAN 100 performs that task. Thus, the lower-main switch 232 having a breakdown voltage of 100V or less, and in some cases about 80V, is sufficient. The interruption of the current flow commutates the shutoff current to flow through the body diode of FET 912 of switch 832 and resistors 908 and 910. At some point in the example situation, the controller 816 may make switch 236 conductive to reduce current through the resistors 908 and 910, but such is not strictly required.

Consider again a transition from transistor-on mode to off mode, again in the example situation of the positive polarity at the upper terminal 224. When the controller 816 (FIG. 8) transitions the B-TRAN 100 from conductive to non-conductive, the example system of FIG. 9 may extract charge carriers through the upper base 114 by way of the switch illustratively shown as FET 914 and source of charge carriers 916. In particular, when the controller 816 transitions from the transistor-on mode to the off mode, the controller 816 may be designed and constructed to implement an intermediate step by assertion of the gate of FET 914, making the FET conductive and thus coupling the source of charge carriers 916 between the upper base 114 and the upper terminal 224. The polarity of the source of charge carriers 916 extracts charge carriers from the drift region through upper base 114, which enables a faster transition to non-conductive than, for example, implementing the pre-turn-off mode (FIG. 7) or electrically floating the upper base 114. Stated in terms of slope of the forward voltage drop, the example polarity of the source of charge carriers 916 increases the upward slope of the forward voltage drop, which decreases switching time and thus decreases switching losses. In example cases, the source of charge carriers 916 may be a voltage source (e.g., between 5.0V and 15V, inclusive, illustratively shown as 12V), and extracting the charge carriers may reduce the time to transition from a conductive state to the off mode by between about 0.5 μs and 2 μs, inclusive. The diode 918 ensures blocking of reverse current flow to the upper base 114 through this path of the driver 802. A similar decrease in transition time may be achieved for situations in which the positive polarity is on the lower terminal 234 by way of FET 920, source of charge carriers 922, and diode 924.

In yet still other cases, during a transition from transistor-on mode to off mode, both FET 914 and FET 920 may be made conductive, and thus both sources of charge carriers 916 and 922 extract charge carriers. The period within which both FETs 914 and 920 are conductive may be a relatively short period, between about 0.5 μs and 2 μs, inclusive. Further still, only one of FETs 914 and 920 may be made conductive as part of the transition, independent of the polarity applied across the terminals 224 and 234.

Figure 10:
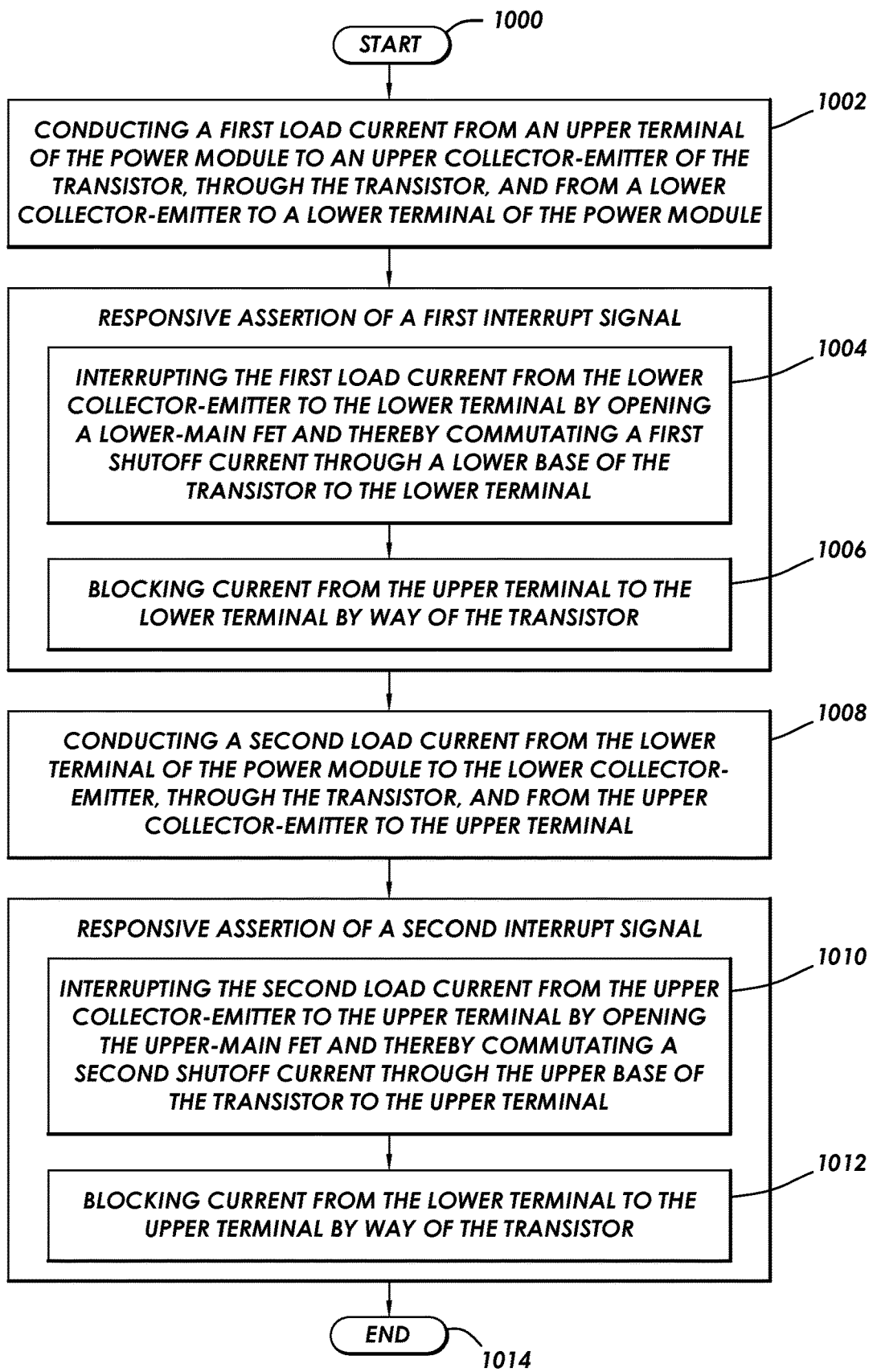
FIG. 10 shows a method in accordance with at least some embodiments.

FIG. 10 shows a method in accordance with at least some embodiments. In particular, the method starts (block 1000) and comprises: conducting a first load current from an upper terminal of the power module to an upper collector-emitter of the transistor, through the transistor, and from a lower collector-emitter to a lower terminal of the power module (block 1002); and then responsive assertion of a first interrupt signal, interrupting the first load current from the lower collector-emitter to the lower terminal by opening a lower-main FET and thereby commutating a first shutoff current through a lower base of the transistor to the lower terminal (block 1004); and blocking current from the upper terminal to the lower terminal by way of the transistor (block 1006). The example may further comprise: conducting a second load current from the lower terminal of the power module to the lower collector-emitter, through the transistor, and from the upper collector-emitter to the upper terminal (block 1008); and then responsive assertion of a second interrupt signal, interrupting the second load current from the upper collector-emitter to the upper terminal by opening an upper-main FET and thereby commutating a second shutoff current through the upper base to the upper terminal (block 1010); and blocking current from the lower terminal to the upper terminal by way of the transistor (block 1012). Thereafter, the method ends (block 1014).

Figure 11:
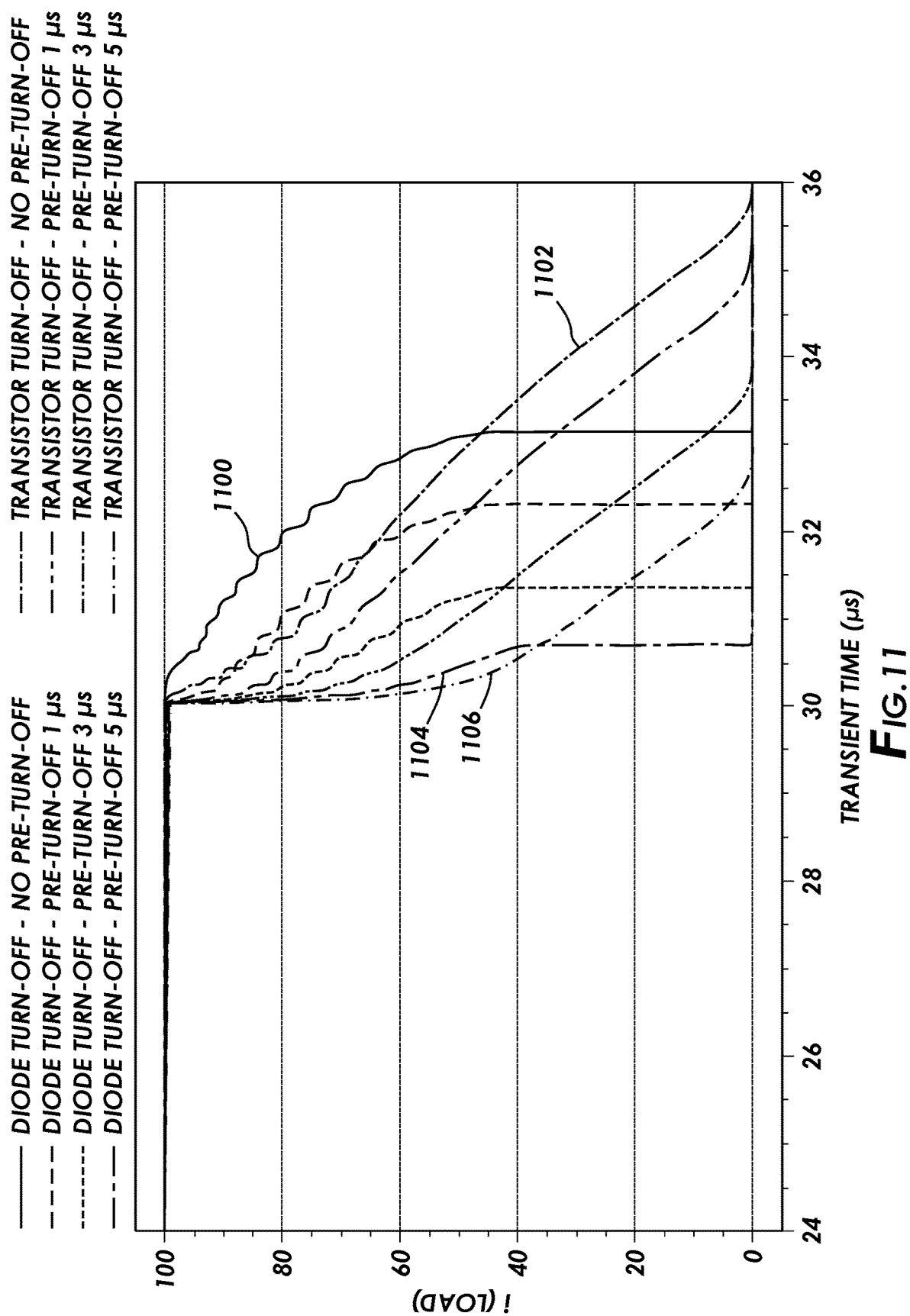
FIG. 11 shows a plot of transient times for transitioning to a non-conductive state in accordance with at least some embodiments.

FIG. 11 shows a plot of transient times for transitioning a B-TRAN from conductive to non-conductive. In particular, FIG. 11 co-plots several implementations of diode turn-off of the examples herein, along with corresponding examples of three-terminal or transistor turn-off of the related art. The vertical axis is load current through the B-TRAN in Amps, and the horizontal axis is transient time in microseconds from an arbitrary start time. The various plots were created using a simulation program (e.g., a Technology Computer-Aided Design (TCAD) program) with the switch assembly controller current to a resistive load. The example plot 1100 shows the transient time for a diode turn-off without the using a pre-turn-off mode, such as transitioning from transistor-on mode (FIG. 5) directly to off mode (FIG. 3). Moreover, for the plot 1100 the transition begins at an arbitrary time 30 μs, and thus the transient time from the example 100A of current to effectively zero current occurs in about 3 μs (i.e., between the 30 μs point and the 33 μs point). By contrast, plot 1102 shows the transient time for a transistor turn-off of the related art without using a pre-turn-off mode, such as transitioning from a conductive mode to a non-conductive mode (FIG. 6). As before, for the plot 1102 the transition begins at the arbitrary time 30 μs, and thus the transient time from the example 100A of current to effectively zero current occurs in about 6 μs—twice as long as the example cases herein.

The transient time for the diode turn-off shown by plot 1100 again is without any pre-turn-off. However, the transient time may be made even shorter by implementation of a pre-turn-off mode (e.g., FIG. 7) between the transistor-on mode (e.g., FIG. 5) and the off mode (e.g., FIG. 3). For example, plot 1104 shows a transient time for a diode turn-off using a pre-turn-off mode of 5 μs. That is, in example systems the switch assembly may transition from the transistor-on mode (FIG. 5) to the pre-turn-off mode (FIG. 7) for about 5 μs before transitioning to the off mode (FIG. 3). That is, from the transistor-on mode (FIG. 5) the switch assembly implements the pre-turn-off mode (FIG. 7) at about the 25 μs point in the horizontal time scale of FIG. 11. As noted above, the pre-turn-off mode may drain charge carriers from the drift region of the B-TRAN, and thus decrease the saturation state of the device, though as shown the amount of current through the B-TRAN is reduced only slightly. At about the 30 μs point, the example switch assembly transitions to the off mode (FIG. 3), and plot 1104 shows the transient time associated with the transition. Thus, using the pre-turn-off mode (FIG. 7) may make the transient time (measured from the implementation of the off mode of FIG. 3) to less than 1 μs. By contrast, as shown by plot 1106, even implementing a pre-turn-off having a duration of 5 μs the transistor turn-off may be shortened only to just under 3 μs.

Having shorter transient times may have several advantages, not all of which need be present in each implementation. For example, with shorter transient of the diode turn-off, switching losses may be reduced compared to transistor turn-offs. Comparing switching losses for a diode turn-off (with no pre-turn-off) to a transistor turn-off (with no pre-turn-off), the switching losses maybe cut in half. Shorter transient times also enable higher frequency operation for situations in which increased frequency is desired.

While the upper-main switch and lower-main switch each have a corresponding voltage drop when fully conductive, when implemented as power FETs the forward voltage drops are small (e.g., 0.01V to 0.1 V), and in many cases negligible, compared to the forward voltage drop of the associated B-TRAN (e.g., 0.2V to 0.6V). Moreover, it is noted that the shutoff current that flows through the base on the opposite side from the positive polarity during a transition from conductive to non-conductive may have a peak current about equal to the load current; however, while the base regions and connections may not be designed to handle full load current for extended periods of time, the inventors of the present specification have found through simulations that given the transient nature of the shutoff current (e.g., 1 μs to 3 μs), even shutoff currents with peaks equal to the load current do not adversely affect operation of the device.

Many of the electrical connections in the drawings are shown as direct couplings having no intervening devices, but not expressly stated as such in the description above. Nevertheless, this paragraph shall serve as antecedent basis in the claims for referencing any electrical connection as "directly coupled" for electrical connections shown in the drawing with no intervening device(s). Moreover, this paragraph shall not negate that a base electrically connected to a collector-emitter through a transistor may be referred to as "directly coupled."

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

We claim:

1. A method of operating a power module having a bi-directional double-base bipolar junction transistor, the method comprising:
    conducting a first load current from an upper terminal of the power module, through the transistor, and from a lower-main lead of the transistor to a lower terminal of the power module; and then responsive assertion of a first interrupt signal
    interrupting the first load current from the lower-main lead to the lower terminal by opening a lower-main FET and commutating a first shutoff current through a lower-control lead of the transistor to the lower terminal; and
    blocking current from the upper terminal to the lower terminal by the transistor.

2. The method of claim 1:
    wherein interrupting the first load current further comprises interrupting the first load current with the lower-main FET having a breakdown voltage of 100 Volts or less; and
    wherein blocking current further comprises blocking at an applied voltage across the upper terminal and the lower terminal of 600 Volts or greater.

3. The method of claim 1 further comprising, after blocking current from the upper terminal to the lower terminal:
    conducting a second load current from the lower terminal of the power module, through the transistor, and from an upper-main lead of the transistor to the upper terminal; and then responsive to assertion of a second interrupt signal
    interrupting the second load current from the upper-main lead to the upper terminal by opening an upper-main FET and commutating a second shutoff current through an upper-control lead of the transistor to the upper terminal; and
    blocking current from the lower terminal to the upper terminal by the transistor.

4. The method of claim 3:
    wherein interrupting the second load current further comprises interrupting the second load current with the upper-main FET having a breakdown voltage of 100 Volts or less; and
    wherein blocking current from the lower terminal to the upper terminal further comprises blocking at an applied voltage across the lower terminal and the upper terminal of 600 Volts or greater.

5. The method of claim 1 transistor is at least one selected from a group comprising: a NPN transistor; and a PNP transistor.

6. A switch assembly comprising:
an upper terminal, a lower terminal, and an upper-control input;
a transistor defining an upper-control lead, an upper-main lead, a lower-control lead, and a lower-main lead;
an upper-main FET defining a first lead coupled to the upper terminal, a second lead coupled to the upper-main lead, and a gate;
a lower-main FET defining a first lead coupled to the lower-main lead, a second lead coupled to the lower terminal, and a gate;
a controller coupled to the upper-control input, the gate of the upper-main FET, and the gate of the lower-main FET, and for a first applied voltage across the upper terminal and the lower terminal, the controller configured to:
assert the gate of the upper-main FET to make the upper-main FET conductive, arrange the transistor for conduction, and assert the gate of the lower-main FET to make the lower-main FET conductive such that a first load current flows from the upper terminal to the lower terminal;
sense de-assertion of the upper-control input; and responsive to de-assertion of the upper-control input de-assert the gate of the lower-main FET to interrupt the first load current and commutate a first shutoff current through the lower-control lead to the lower terminal; and
arrange the transistor to block current flow from the upper terminal to the lower terminal.

7. The switch assembly of claim 6 wherein the breakdown voltage of the transistor is 600 Volts or greater, and the breakdown voltage of the lower-main FET is 100 Volts or less.

8. The switch assembly of claim 6 wherein the breakdown voltage of the transistor is about 1200 Volts, and the breakdown voltage of the lower-main FET is 80 Volts or less.

9. The switch assembly of claim 6 further comprising:
an upper-control FET having a first lead coupled to the upper-control lead, a second lead coupled to the upper terminal, and a gate, and during periods when the first load current flows from the upper terminal to the lower terminal, the upper-control FET is conductive; and
wherein when the controller arranges the transistor to block current flow from the upper terminal to the lower terminal, the controller is further configured to de-assert the gate of the upper-control FET to electrically float the upper-control lead.

10. The switch assembly of claim 6 further comprising:
a lower-control input coupled to the controller; and
wherein for a second applied voltage across the upper terminal and lower terminal, the second applied voltage having a polarity opposite the first applied voltage, the controller is further configured to:
assert the gate of the lower-main FET to make the lower-main FET conductive, arrange the transistor for conduction, and assert the gate of the upper-main FET to make the upper-main FET conductive such that a second load current flows from the lower terminal to the upper terminal;
sense de-assertion of the lower-control input; and responsive to de-assertion of the lower-control input de-assert the gate of the upper-main FET to interrupt the second load current and commutate a second shutoff current through the upper-control lead to the upper terminal; and
arrange the transistor to block current flow from the lower terminal to the upper terminal.

11. The switch assembly of claim 10 further comprising:
a lower-control FET having a first lead coupled to the lower-control lead, a second lead coupled to the lower terminal, and a gate, and during periods when the second load current flows from the upper terminal to the lower terminal, the lower-control FET is conductive; and
wherein when the controller arranges the transistor to block current flow from the lower terminal the upper terminal, the controller is further configured to de-assert the gate of the lower-control FET to electrically float the lower-control lead of the transistor.

12. The switch assembly of claim 10 wherein the breakdown voltage of the transistor is 600 Volts or greater, and the breakdown voltage of the lower-main FET is 100 Volts or less.

13. The switch assembly of claim 6 wherein the transistor is at least one selected from a group comprising: a NPN transistor; and a PNP transistor.

14. A method of operating a bi-directional double-base bipolar junction transistor, the method comprising:
making the transistor conductive from an upper-main lead to a lower-main lead by supplying current to an upper-control lead of the transistor and electrically floating a lower-control lead of the transistor; and then
making the transistor non-conductive by electrically floating the upper-control lead, electrically floating the lower-main lead, and conducting a shutoff current through the lower-control lead.

15. The method of claim 14 wherein electrically floating the lower-main lead further comprises making non-conductive a lower-main electrically-controlled switch coupled to the lower-main lead of the transistor.

16. The method of claim 14 wherein making the transistor conductive further comprises:
closing an upper-main electrically-controlled switch coupled between an upper terminal and the upper-main lead; and
closing a lower-main electrically-controlled switch coupled between a lower terminal and the lower-main lead.

17. The method of claim 16 wherein making the transistor non-conductive further comprises:
opening the upper-main electrically-controlled switch;
conducting the shutoff current to the upper-main lead through a diode associated with the upper-main electrically-controlled switch; and
commutating the shutoff current through the lower-control lead by opening the lower-main electrically-controlled switch.

18. The method of claim 14 wherein conducting the shutoff current through the lower-control lead further comprises conducting current through a diode associated with an electrically-controlled switch coupled to the lower-control lead.

19. The method of claim 14 wherein supplying current to the upper-control lead further comprises at least one selected from a group comprising: supplying current at a voltage about the same as a voltage applied to the upper-main lead; and supplying current at a voltage higher than a voltage applied at the upper-main lead.

20. The method of claim 14 wherein the transistor is at least one selected from a group comprising: a NPN transistor; and a PNP transistor.

* * * * *